United States Patent
Itoga et al.

(10) Patent No.: US 10,957,826 B2
(45) Date of Patent: Mar. 23, 2021

(54) WHITE LIGHT SOURCE INCLUDING LED AND PHOSPHORS

(71) Applicants: KABUSHIKI KAISHA TOSHIBA, Tokyo (JP); TOSHIBA MATERIALS CO., LTD., Yokohama (JP)

(72) Inventors: Tatsunori Itoga, Yokohama (JP); Ryoji Tsuda, Fujisawa (JP); Naotoshi Matsuda, Chigasaki (JP); Yoshitaka Funayama, Yokohama (JP)

(73) Assignees: Kabushiki Kaisha Toshiba, Tokyo (JP); Toshiba Materials Co., Ltd., Yokohama (JP)

( * ) Notice: Subject to any disclaimer, the term of this patent is extended or adjusted under 35 U.S.C. 154(b) by 38 days.

(21) Appl. No.: 16/196,095

(22) Filed: Nov. 20, 2018

(65) Prior Publication Data

US 2019/0088833 A1    Mar. 21, 2019

Related U.S. Application Data

(63) Continuation of application No. PCT/JP2017/018892, filed on May 19, 2017.

(30) Foreign Application Priority Data

May 20, 2016  (JP) ............................. JP2016-101548

(51) Int. Cl.
*H01L 33/50* (2010.01)
*C09K 11/64* (2006.01)
(Continued)

(52) U.S. Cl.
CPC ........ *H01L 33/504* (2013.01); *C09K 11/0883* (2013.01); *C09K 11/64* (2013.01);
(Continued)

(58) Field of Classification Search
None
See application file for complete search history.

(56) References Cited

U.S. PATENT DOCUMENTS

| 6,504,179 B1 | 1/2003 | Ellens et al. |
| 2003/0092345 A1 | 5/2003 | Wang et al. |

(Continued)

FOREIGN PATENT DOCUMENTS

| EP | 1 753 840 B1 | 5/2008 |
| JP | 3503139 B2 | 3/2004 |

(Continued)

OTHER PUBLICATIONS

"Issues of LED Lighting (Biological Safety)," Japanese National Committee of CIE, *Journal of Science and Technology in Lighting*, vol. 94, No. 44, Apr. 2010, pp. 240-244 (with English translation).

(Continued)

*Primary Examiner* — Suberr L Chi
(74) *Attorney, Agent, or Firm* — Burr & Brown, PLLC

(57) ABSTRACT

According to one embodiment, a white light source includes a combination of a light emitting diode and phosphors. One of the phosphors is at least a cerium activated yttrium aluminum garnet-based phosphor. There is no light emission spectrum peak at which a ratio of a largest maximum value to a minimum value is greater than 1.9. The largest maximum value is largest among at least one maximum value present in a wavelength range of 400 nm to 500 nm in a light emission spectrum of white light emitted from the white light source. The minimum value is adjacent to the largest maximum value in a longer wavelength side of the light emission spectrum.

12 Claims, 6 Drawing Sheets

(51) Int. Cl.
*C09K 11/73* (2006.01)
*C09K 11/66* (2006.01)
*C09K 11/08* (2006.01)
*C09K 11/77* (2006.01)
*H01L 25/075* (2006.01)

(52) U.S. Cl.
CPC .............. *C09K 11/66* (2013.01); *C09K 11/73* (2013.01); *C09K 11/7734* (2013.01); *C09K 11/7739* (2013.01); *C09K 11/7774* (2013.01); *H01L 25/0753* (2013.01); *H01L 33/50* (2013.01); *Y02B 20/00* (2013.01)

(56) References Cited

U.S. PATENT DOCUMENTS

| | | |
|---|---|---|
| 2003/0124246 A1 | 7/2003 | Chen |
| 2004/0000868 A1 | 1/2004 | Shimizu et al. |
| 2005/0224828 A1 | 10/2005 | Oon et al. |
| 2007/0257597 A1 | 11/2007 | Sakata et al. |
| 2008/0149957 A1 | 6/2008 | Kameshima et al. |
| 2011/0006325 A1 | 1/2011 | Ishii et al. |
| 2011/0216522 A1 | 9/2011 | Harbers et al. |
| 2011/0220920 A1 | 9/2011 | Collins et al. |
| 2011/0317283 A1 | 12/2011 | Shim |
| 2018/0139817 A1* | 5/2018 | Yamakawa ........... H01L 33/507 |

FOREIGN PATENT DOCUMENTS

| | | |
|---|---|---|
| JP | 3700502 B2 | 9/2005 |
| JP | 4989936 B2 | 8/2012 |
| JP | 2013-521617 A1 | 6/2013 |
| JP | 2013-175548 A1 | 9/2013 |
| JP | 5330263 B2 | 10/2013 |
| JP | 5390390 B2 | 1/2014 |
| WO | 2005/116163 A1 | 12/2005 |
| WO | 2006/064930 A1 | 6/2006 |
| WO | 2006/077740 A1 | 7/2006 |

OTHER PUBLICATIONS

International Search Report and Written Opinion (Application No. PCT/JP2017/018892) dated Jul. 18, 2017.
Extended European Search Report (Application No. 17799521.4) dated Jan. 13, 2020.

* cited by examiner

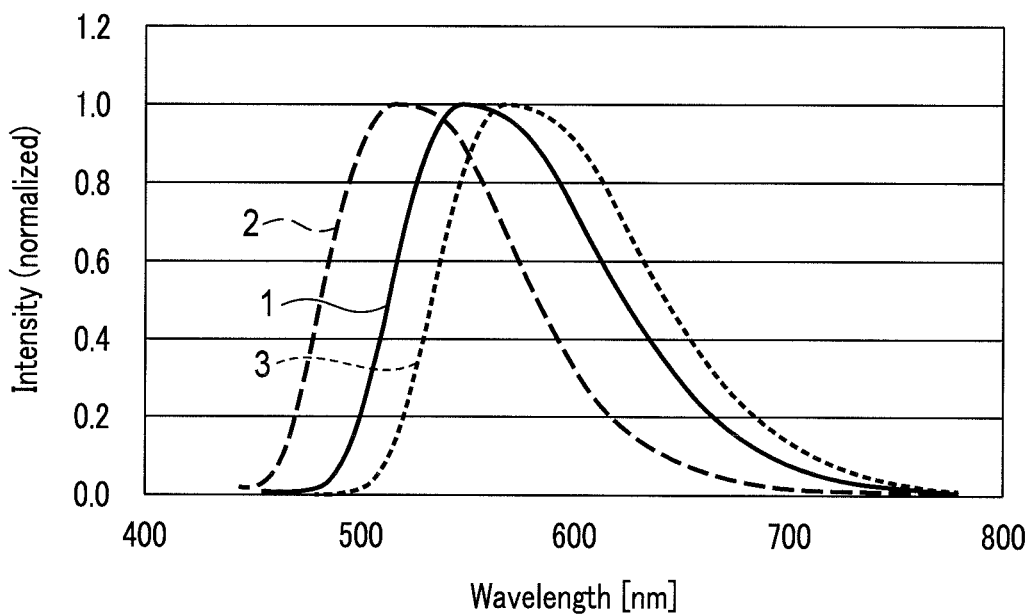
F I G. 1
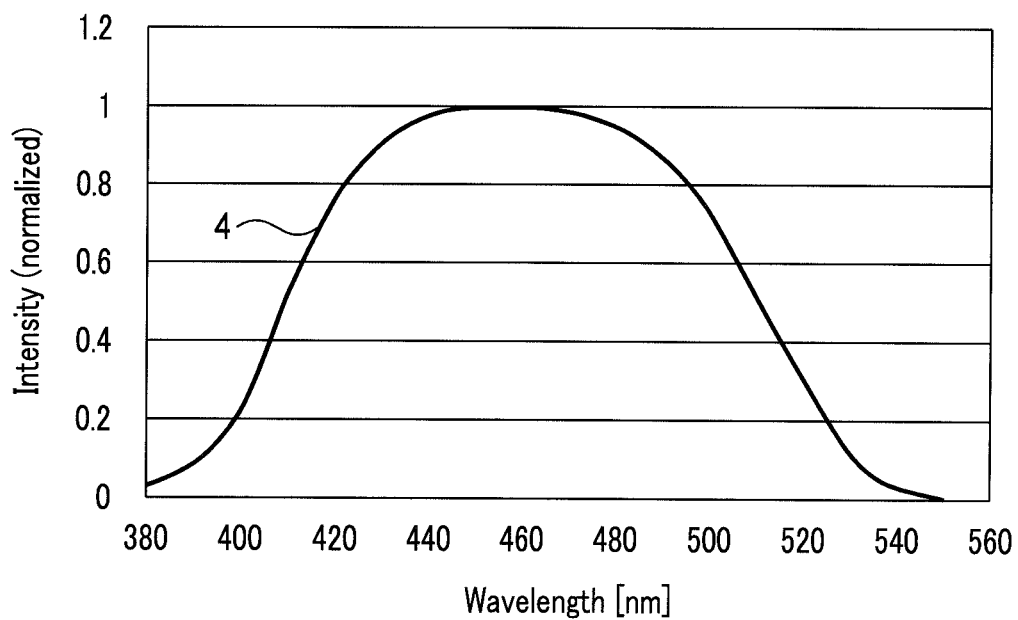
F I G. 2

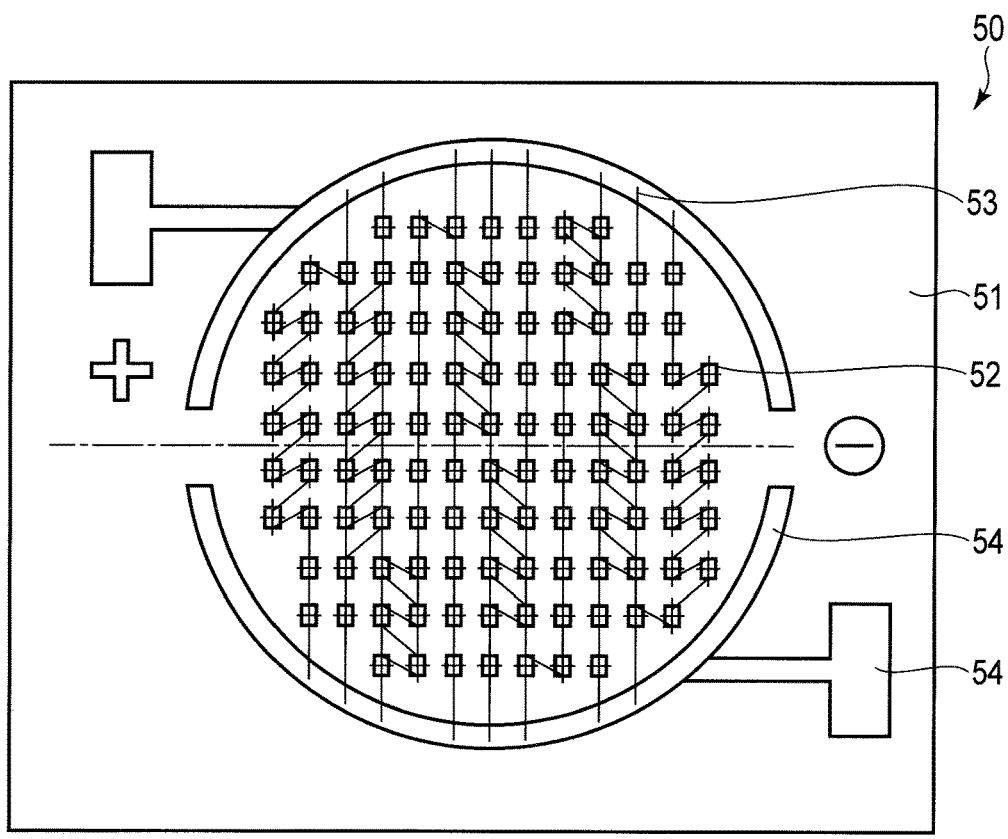
F I G. 7
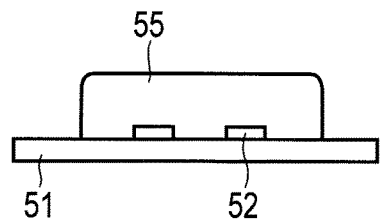
F I G. 8
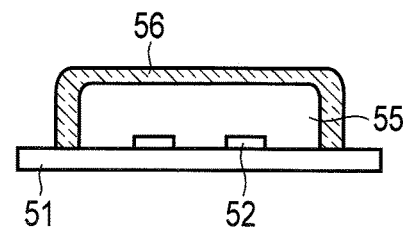
F I G. 9

WHITE LIGHT SOURCE INCLUDING LED AND PHOSPHORS

CROSS-REFERENCE TO RELATED APPLICATIONS

This application is a Continuation Application of PCT Application No. PCT/JP2017/018892, filed May 19, 2017 and based upon and claiming the benefit of priority from Japanese Patent Application No. 2016-101548, filed May 20, 2016, the entire contents of all of which are incorporated herein by reference.

BACKGROUND OF THE INVENTION

1. Field of the Invention

The present invention relates to a white LED that is a white light source for illumination which can be used not only in homes and offices, but also for special uses in museums and hospitals, for example, and can provide bright light having high color rendering with consideration of human health, etc.

2. Description of Related Art

It has been about twenty years since the development of white LEDs, and their features, such as compactness, long life, low voltage driving, mercury free, etc., have been recognized in the market. White LEDs have taken the place of conventional fluorescent lamps (FL), incandescent bulbs and even halogen bulbs, and have become widely available as the most promising products in the lighting products market.

There are mainly two representative configuration types of white LED products: a combination of a light emitting diode emitting near ultraviolet to violet light (350 to 420 nm) with a phosphor which absorbs primary light from the light emitting diode and emits secondary light, and a combination of a light emitting diode emitting blue light (430 to 480 nm) with the phosphor.

Of the two types of white LED, the one that uses a near-ultraviolet to violet light (350 to 420 nm) emitting diode (hereinafter referred to as an ultraviolet to violet LED) obtains white light by using phosphors in three to four colors of blue, green to yellow, and red. The other one that uses a blue light (430 to 480 nm) emitting diode (hereinafter referred to as a blue LED) obtains white light by using phosphors in two to three colors of green to yellow and red, or by mainly using a yellow phosphor.

In the type that uses a blue LED, the combination of a blue LED and phosphors of at least two colors of green to yellow and red has a problem of large color unevenness and large variation in luminescent chromaticity, and the combination of a blue LED and a yellow phosphor has a problem that white light having poor color rendering and lacking in warmth can only be obtained. Furthermore, whichever phosphor is used, since the emission intensity of a blue LED is too strong, problems such as blue light hazards have been pointed out in the market. Exposure to strong blue light causes health problems to the human body, such as eye strain and upset circadian rhythm.

In contrast, the type that uses an ultraviolet to violet LED has advantages of wide color reproducibility and flexibility in obtaining white light with predetermined chromaticity, because there are many choices of phosphors that can be used in combination with an ultraviolet to violet LED compared to the type that uses a blue LED. Furthermore, almost the entire amount of sharp light emitted by the LED of this type is absorbed and converted into visible light by a phosphor; it is thus possible to obtain natural white light close to conventional white light emitted from, for example, fluorescent lamps and incandescent lamps. Thus, a light source that well addresses problems such as blue light hazards can be provided.

PRIOR ART DOCUMENTS

Patent Documents

[Patent Document 1] Japanese Patent No. 3700502
[Patent Document 2] Japanese Patent No. 3503139
[Patent Document 3] Japanese Patent No. 4989936
[Patent Document 4] Japanese Patent No. 5330263
[Patent Document 5] Japanese Patent No. 5390390

Non-Patent Document

[Non-Patent Document 1] Journal of the Illuminating Engineering Institute of Japan, Vol. 94, No. 4, April 2010

BRIEF DESCRIPTION OF THE DRAWINGS

FIG. 1 is a diagram showing an emission spectrum of a green to yellow emitting phosphor (a YAG phosphor).
FIG. 2 is a diagram showing an excitation spectrum of a green to yellow light emitting phosphor (a YAG phosphor).
FIG. 7 is a schematic diagram showing an example of a white light source according to the present invention.
FIG. 8 is a cross-sectional view showing a first example of an LED module used for the white light source.
FIG. 9 is a cross-sectional view showing a second example of the LED module used for the white light source.

DETAILED DESCRIPTION OF THE INVENTION

Figure 3:
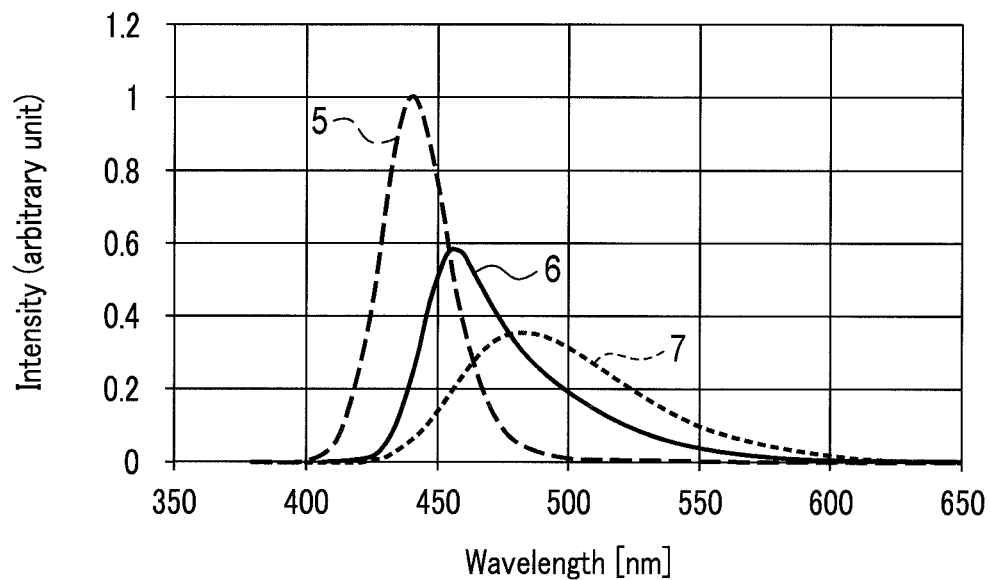
FIG. 3 is a diagram showing an emission spectrum of a blue phosphor (alkaline earth halophosphate).

According to the present invention, the following white light sources are provided.

[1] A white light source comprises a combination of a light emitting diode (hereinafter referred to as an LED) and phosphors, one of the phosphors being at least a cerium activated yttrium aluminum garnet-based phosphor, the white light source characterized in that there is no light emission spectrum peak at which a ratio of a largest maximum value to a minimum value (light emission spectrum intensity in a wavelength that indicates a maximum value/ light emission spectrum intensity in a wavelength that indicates a minimum value) is greater than 1.9, the largest maximum value is largest among at least one maximum value present in a wavelength range of 400 nm to 500 nm in a light emission spectrum of white light emitted from the white light source, and the minimum value is adjacent to the largest maximum value in a longer wavelength side of the light emission spectrum.

[2] The white light source described in [1], characterized in that the LED emits ultraviolet to violet light having an emission peak in a wavelength range of 350 nm to 420 nm, the phosphors constitute a mixed phosphor that further includes a blue phosphor, and white light emitted from the mixed phosphor has a continuous spectrum over a wavelength range of 400 nm to 780 nm.

[3] The white light source described in [1] or [2], characterized in that the cerium activated yttrium aluminum garnet-based phosphor is a green to yellow phosphor having an emission peak in a wavelength range of 510 nm to 570 nm, the blue phosphor is made of at least one of a europium activated alkaline earth halophosphate phosphor and a europium activated barium magnesium aluminate phosphor, and has an emission peak in a wavelength range of 430 nm to 480 nm.

[4] The white light source described in [3], characterized in that the blue phosphor is a europium activated alkaline earth halophosphate phosphor, and has a chemical composition expressed as $(Sr_{1-x-y}Ba_xCa_y)_5(PO_4)_3Cl:Eu$ (x and y satisfy $0 \leq x \leq 0.44$, $0 \leq y \leq 0.01$).

[5] The white light source described in [4], characterized in that an emission peak wavelength of the blue phosphor is in a range of 440 nm to 470 nm.

[6] The white light source described in any one of [4] to [5], characterized in that the blue phosphor is a europium activated alkaline earth halophosphate phosphor, and has a chemical composition expressed as $(Sr_{1-x-y}Ba_xCa_y)_5(PO_4)_3Cl:Eu$ (x and y satisfy $0 \leq x \leq 0.35$ and $0 \leq y \leq 0.01$).

[7] The white light source described in any one of [1] to [6], characterized in that an average particle diameter of the phosphors is 10 μm or longer and 50 μm or shorter.

[8] The white light source described in any one of [1] to [7], characterized in that the phosphors further include a red phosphor, and the red phosphor is at least one of a europium activated strontium sialon phosphor, a europium activated alkaline earth nitride aluminosilicate phosphor, and a manganese activated magnesium fluorogermanate phosphor.

[9] The white light source described in any one of [4] to [8], characterized in that the phosphors include two kinds of phosphor, the cerium activated yttrium aluminum garnet-based phosphor and a europium activated alkaline earth halophosphate phosphor, a weight ratio of the cerium activated yttrium aluminum garnet-based phosphor to the europium activated alkaline earth halophosphate phosphor is in the range of 29:71 parts by weight to 10:90 parts by weight.

[10] The white light source described in any one of [1] to [9], characterized in that an average color rendering index Ra of white light emitted from the white light source is 96 or higher, and all of the color rendering indices R1 to R15 are 85 or higher.

[11] The white light source described in [3], characterized in that the blue phosphor is a europium activated alkaline earth halophosphate phosphor, and has a chemical composition expressed as $(Sr_{1-x-y}Ba_xCa_y)_5(PO_4)_3Cl:Eu$ (x and y satisfy $0 \leq x \leq 0.44$ and $0 \leq y \leq 0.1$).

[12] The white light source described in [11], characterized in that an emission peak wavelength of the blue phosphor is in a range of 440 nm to 470 nm.

[13] The white light source described in any one of [11] and [12], characterized in that the blue phosphor is a europium activated alkaline earth halophosphate phosphor, and has a chemical composition expressed as $(Sr_{1-x-y}Ba_xCa_y)_5(PO_4)_3Cl:Eu$ (x and y satisfy $0 \leq x \leq 0.35$ and $0 \leq y \leq 0.1$).

[14] The white light source described in any one of [11] to [13], characterized in that the phosphors include two kinds of phosphor, the cerium activated yttrium aluminum garnet-based phosphor and a europium activated alkaline earth halophosphate phosphor, a weight ratio of the cerium activated yttrium aluminum garnet-based phosphor to the europium activated alkaline earth halophosphate phosphor is in the range of 29:71 parts by weight to 10:90 parts by weight.

[15] The white light source described in [2], characterized in that the cerium activated yttrium aluminum garnet-based phosphor is a green to yellow phosphor having an emission peak in a wavelength range of 510 nm to 570 nm, and the blue phosphor is a mixed phosphor consisting of at least one type of first blue phosphor having an emission peak in a range of 430 nm to 470 nm and at least one type of second blue phosphor having an emission peak in a range of a wavelength longer than 470 nm to 485 nm, the first blue phosphor is at least one of a europium activated alkaline earth halophosphate phosphor and a europium activated alkaline earth aluminate phosphor, and the second blue phosphor is a europium activated alkaline earth halophosphate phosphor.

[16] The white light source described in [15], characterized in that the first blue phosphor contained in the mixed phosphor is 50 wt % by weight or more with respect to an entire blue phosphor, and the second blue phosphor contained in the mixed phosphor is 50 wt % or less with respect to the entire blue phosphor.

[17] The white light source described in any one of [3] to [16], characterized in that the white light source further comprises a europium activated alkaline earth orthosilicate phosphor as the green to yellow phosphor.

[18] The white light source described in any one of [1] to [17], characterized in that the phosphors further include a red phosphor, and the red phosphor is at least one of a europium activated strontium sialon phosphor, a europium activated alkaline earth nitride aluminosilicate phosphor, and a manganese activated magnesium fluorogermanate phosphor.

[19] The white light source described in any one of [1] to [18], characterized in that an average particle diameter of each of the phosphors is 10 μm or longer and 50 μm or shorter.

[20] The white light source described in any one of [1] to [19], characterized in that an average color rendering index Ra of white light emitted from the white light source is 96 or higher, and all of the color rendering indices R1 to R15 are 85 or higher.

The foregoing white light sources are achieved based on the following findings.

A white LED that uses an ultraviolet to violet LED has an advantage of being able to obtain human-friendly white light with high color rendering, but there is a problem that the intensity of the obtained white light emission is inferior to that of a white LED that uses a blue LED. In particular, the difference therebetween in the light emission intensity tends to become greater when they are continuously lighted for a long time.

Such a problem arises in a white LED that uses an ultraviolet to violet LED because of differences in characteristics of the phosphors used therein. The problem depends on the type of phosphor that produces green to yellow light. When combined with a blue LED, a cerium activated yttrium aluminum garnet phosphor (hereinafter, referred to as a YAG phosphor) is generally used, and when combined with an ultraviolet to violet LED, although there are several choices, a europium activated alkaline earth orthosilicate phosphor is typically used.

These two kinds of phosphor are promising materials as phosphors that emit green to yellow light, and the levels of emission intensity thereof are substantially the same. The YAG phosphor is excellent not only in emission intensity but also in hardness, strength, heat resistance, and corrosion resistance, and it is thus a stable and strong material. Accordingly, when the luminescent properties of these two kinds of phosphor are compared in a comprehensive manner, even if the luminescence intensity levels at the initial stage of lighting are substantially equal, in the case of long-time continuous lighting, the europium activated alkaline earth orthosilicate phosphor tends to be strongly influenced by the operating environment, and the luminescence intensity thereof tends to be degraded more greatly than that of the YAG phosphor. Particularly, the europium activated alkaline earth orthosilicate phosphor is susceptible to the influence of moisture in the air, etc. In the case of long-time continuous lighting, there are great differences in characteristics between the europium activated alkaline earth orthosilicate phosphor and the YAG phosphor.

If the above-described problems of the white LED using an ultraviolet to violet LED are caused by a type of green to yellow phosphor used in the white LED, the problems should be solved by a combination of an ultraviolet to violet LED and the YAG phosphor. However, whereas the YAG phosphor brightly emits green to yellow light when used in combination with a blue LED, there is a problem that the YAG phosphor emits almost no light, let alone yellow light, when used in combination with an ultraviolet to violet LED. Such a new problem arises because the excitation spectrum of the YAG phosphor is present in the blue wavelength range but is not present in the ultraviolet to violet range. Accordingly, a conventional white LED using an ultraviolet to violet LED would not prompt the idea of using YAG as a phosphor, and for this reason, a europium activated alkaline earth orthosilicate phosphor has been used as a substitute for the YAG phosphor for many years.

The white LED of the present invention includes at least three members, namely an ultraviolet to violet LED, a blue phosphor, and a YAG phosphor. For the blue phosphor, a material that absorbs ultraviolet light and violet light emitted from the LED and converts the light into blue light is used. The YAG phosphor absorbs and converts the blue light emitted from the blue phosphor, and emits green to yellow light obtained by the conversion. A part of the blue light emitted from the blue phosphor is then emitted outside the apparatus without being converted, and the other part of the blue light is converted into green to yellow light by the YAG phosphor and then emitted outside the apparatus; as a result, a mixture of the blue light and the green to yellow light is emitted from the light emitting device as white light.

Only the constituent members essential to the present invention have been described above; however, the kinds of phosphor to be used, etc. may be further increased in the above white LED. In order to obtain white light, it is desirable to include all the phosphors corresponding to the three primary colors (red, green, blue), and to additionally use a red phosphor. Furthermore, the white LED of the present invention is characterized by its high color rendering, and a blue-green phosphor or a deep red phosphor may be further added. In such a light-emitting device, it is possible to reproduce natural white light as if it were sunlight, because the white light emitted from this device includes just enough visible light components of all wavelengths constituting natural white light.

The white LED of the present invention can solve the problem of emission intensity, particularly the problem of strength degradation during continuous lighting over a long period of time which has been regarded as a conventional drawback of white LEDs, while taking advantage of the ability to reproduce white light of various color temperatures and high color rendering, which are features of a light emitting device using an ultraviolet to violet LED, and can provide white light with excellent reliability.

The white LED of the present invention can provide white light with consideration of health and without fear of blue light hazards etc., while incorporating the above advantages provided by use of the YAG phosphor. Since YAG phosphors are not excited by ultraviolet light or violet light and do not emit light upon such excitation, they have been conventionally used only in combination with blue LEDs. In the spectral distribution of white light emitted from a white light source using a blue LED, it is impossible to prevent a strong emission peak occurring in a specific wavelength of blue light because the light from the LED is directly used for the blue color component. Since the cells related to circadian rhythm in the human eyeballs have high sensitivity to blue light, it is said that the presence of a strong emission peak in the blue wavelength range results in excessive absorption of blue light into human bodies, which causes various adverse effects on human bodies.

In the case of the white LED of the present invention on the other hand, instead of using light directly emitted from the LED, secondary light obtained by absorbing and converting by a phosphor ultraviolet to violet light emitted from the LED, is used for the blue component of white light emission. It is possible to freely adjust an emission wavelength, a spectrum shape, emission intensity and the like by selecting a material as appropriate from various materials that can be used for phosphors that emit blue light. Therefore, it is possible to greatly reduce excessive emission of the blue light component which is regarded as harmful to human bodies.

(Ultraviolet to Violet LED)

It is desirable to use an LED having an emission peak wavelength in the ultraviolet to violet range, specifically, in the range of 350 nm to 420 nm. If the emission peak wavelength is longer than 420 nm, only so-called phosphors that is excited by blue light can be combined with such an LED, and the kinds of usable phosphor are thus remarkably limited; as a result, it is difficult to obtain output white light of any color temperature having high color rendering. There is also a problem that strong blue light emitted from the LED causes blue light hazards, etc. If the peak wavelength is shorter than 350 nm, the excitation wavelength range extends and the variety of kinds of usable phosphor can be thereby increased; on the other hand, in the present state of the art, ultraviolet LEDs having sufficient output intensity have not been yet developed, and the lower limit of the peak wavelength is 350 nm from the viewpoint of obtaining practical brightness. If LEDs with improved output intensity are developed in the future, the lower limit of the emission peak will no longer be limited thereto. Note that no conditions other than the aforementioned limit to the light emission peak wavelength is set as for the types of the LED, and a laser emission type may be used for the LED, and any materials can be used for the LED.

(Green to Yellow Light Emitting Phosphor)

In the present invention, it is preferable to use at least a YAG phosphor as the green to yellow light emitting phosphor. The YAG phosphor is a phosphor ($Y_3Al_5O_{12}$:Ce) made from a garnet-structured material having a composition of $Y_3Al_5O_{12}$ as a host material and cerium (Ce) as an activator. This phosphor emits green to yellow light brightly, and has excellent characteristics as features of the inorganic material having the garnet structure, such as high hardness, high strength, high heat resistance, high corrosion resistance, etc. Therefore, this phosphor is useful as a material that can exhibit stable light emission characteristics in various usage environments, and has been used in various light emitting devices such as mercury lamps and CRTs, besides white LEDs.

FIGS. 1 and 2 show the emission spectrum and the excitation spectrum of the YAG phosphor. The emission spectrum was obtained by exciting a phosphor powder packed in a petri dish with blue light of 450 nm, and measuring the excited phosphor using the C9920-02G absolute PL quantum yield measuring apparatus manufactured by Hamamatsu Photonics K.K.

In the white LED of the present invention, the most desirable emission spectrum of the YAG phosphor is the curve indicated as 1 in FIG. 1, which exhibits yellow light emission having an emission peak at 550 nm and a continuous spectrum in the range of 470 nm to 780 nm. For the range of the peak wavelength usable as the green component or the yellow component of the white light, the lower limit value is desirably 510 nm, which corresponds to the peak wavelength in curve 2 of FIG. 1, and the upper limit value is desirably 570 nm, which corresponds to the peak wavelength in curve 3 of FIG. 1.

FIG. 2 shows the excitation spectrum corresponding to the emission spectrum of the YAG phosphor having the peak wavelength at 550 nm, which is shown in FIG. 1. As can be seen from FIG. 2, the excitation spectrum of the YAG phosphor hardly absorbs light having a wavelength shorter than the blue wavelength, and even when the YAG phosphor is combined with an ultraviolet to violet LED, the phosphor hardly emits light. In order for the YAG phosphor to emit light at a practical level, it is required that the emission peak wavelength of the LED as the excitation source is present in the blue wavelength range. Referring to FIG. 2 to look at the range of the desired peak wavelength required for the emission spectrum of the excitation source, such a range is from 440 nm to 470 nm where an amount of excitation light absorbed by the YAG phosphor falls within the range of 99% of the maximum value to the maximum value, and is from 430 nm to 480 nm where the absorption amount falls within the range 95% of the maximum value to the maximum value.

The YAG phosphor is a phosphor that exhibits a wide emission wavelength range and emits green to yellow light having an emission peak wavelength in the range of 510 nm to 570 nm, and the emission color of the YAG phosphor can be adjusted by changing the concentration of Ce as the activator or by changing the composition of the host material.

For example, by changing the concentration of the activator Ce, the emission peak wavelength of the phosphor can be changed from the green range to the yellow range. In the emission spectrum of the YAG phosphor shown in FIG. 1, the composition formulae, $(Lu_{0.993}Ce_{0.007})_3Al_5O_{12}$, $(Y_{0.983}Ce_{0.017})_3Al_5O_{12}$, and $(Y_{0.933}Ce_{0.067})_3Al_5O_{12}$, respectively correspond to curves 1 to 3. The emission peak wavelength of, including the composition of the host material, the phosphor that exhibits curve 1 has been adjusted in accordance with the reduction in the concentration of Ce.

It is also possible to replace the Y element in the host material $Y_3Al_5O_{12}$ with another rare earth element such as La. Particularly, a LuAG phosphor (in its abbreviated name) in which the Y element is replaced with a Lu element, and a TAG phosphor (in its abbreviated name) in which the Y element is replaced with a Tb element are well-known in the industry.

The emission color can also be changed by adjusting the chemical composition $Y_3Al_5O_{12}$ of the host material. Specifically, the emission color can be changed by finely adjusting the composition ratio of Y and Al while maintaining the garnet crystal structure of the host material. The adjustment of only the composition ratio of Y and Al, however, cannot bring a sufficient amount of change in the color of emitted light; usually a method of synthesizing a solid solution in which a part of Y or Al atoms is replaced with another atom is adopted.

For example, a phosphor having the following composition may be used in which a part of Y is replaced with Gd and a part of Al is replaced with Ga.

$(Y_{1-A}Gd_A)_3(Al_{1-B}Ga_B)_5O_{12}$:Ce

In the above composition, when A=0 and B=0, the phosphor exhibits yellow light emission. Then, when A=0, if B is gradually increased, the emission peak wavelength shifts to the shorter wavelength side, and the entire color of emission shifts to the green side. When B=0, if A is gradually increased, the emission peak wavelength shifts to the longer wavelength side, and the entire color of emission shifts to the yellow side.

It is also possible to replace a part of Y or Al with various kinds of elements. For example, a phosphor may have the following composition:

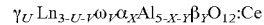

$\gamma_U Ln_{3-U-V}\omega_V\alpha_X Al_{5-X-Y}\beta_Y O_{12}$:Ce

In the above composition formula, Ln is any of a Y, Gd or Lu element, and the basic composition of the host material of this phosphor is $Y_3Al_5O_{12}$. However, it is possible to change the emission color by replacing Y with Lu or trace elements that constitute the pair ($\gamma$, $\omega$), and replacing Al with the trace elements that constitute the pair ($\alpha$, $\beta$). For example, to shift the peak wavelength to the longer wavelength side, the pair ($\alpha$, $\beta$) is replaced with (Mg, Si) and the pair ($\gamma$, $\omega$) is replaced with (Sr, Zr). To shift to the shorter wavelength side, a part of Y may be replaced with Lu. The paired elements are not limited to the above elements; for example, the pair ($\alpha$, $\beta$) may be (B, Sc), and the pair ($\gamma$, $\omega$) may be (Sr, Hf). In these phosphors, the replacement amount falls within the preferable range if the variables x and y satisfy the relational expressions, $x<2$, $y<2$ and $0.9 \le x/y \le 1.1$, and the variables u and v satisfy the relational expressions, $u \le 0.5$, $v \le 0.5$, and $0.9 \le u/v \le 1.1$.

As described above, a YAG phosphor usable in the present invention is a phosphor with various modified compositions having $Y_3Al_5O_{12}$ of a garnet structure as a basic composition. In the present invention, the YAG phosphors having the foregoing various compositions are collectively referred to as YAG-based phosphors or yttrium aluminum garnet-based phosphors. In the present invention, as long as there are no significant differences in light emission characteristics, any YAG-based phosphor having any composition may be used.

(Green to Yellow Light Emitting Phosphor Mixture)

In the white LED of the present invention, at least a YAG-based phosphor needs to be used for the phosphor that emits light of the green to yellow component, but a different phosphor may also be used in addition to the YAG-based phosphor. It is possible to more effectively utilize the features of the YAG-based phosphor by using the YAG-based phosphor alone; however, the YAG-based phosphor may be mixed with an existing effective phosphor to obtain a hybrid phosphor having advantages of the existing phosphor. For example, a europium activated alkaline earth orthosilicate phosphor ((Sr, Ba)$_2$SiO$_4$:Eu) or a europium activated sialon phosphor ((Si, Al)$_6$(O, N)$_8$:Eu) or the like can be mixed or used as the existing phosphor.

If the europium activated alkaline earth orthosilicate phosphor is selected as the phosphor to be combined with the YAG-based phosphor in the hybrid phosphor, it is possible to improve the color rendering as compared to the case where the YAG-based phosphor is used alone. This is because the emission spectrum of the europium activated alkaline earth orthosilicate phosphor has a larger light emission area in the green to yellow wavelength range than that of the emission spectrum of the YAG-based phosphor. A larger proportion of the europium activated alkaline earth orthosilicate phosphor has a greater effect in improving color rendering of the hybrid fluorescent film; however, since improving the luminous flux maintenance factor of the green to yellow fluorescent film is the primary object of the present invention, it is preferable to set the ratio of the YAG-based phosphor to the total weight of the green to yellow phosphor to at least 40 wt %.

(Blue Light Emitting Phosphor)

In the white LED of the present invention, white light cannot be obtained only by a combination of a YAG-based phosphor and an LED, because the white LED of the present invention uses an ultraviolet to violet LED as the LED and a YAG-based phosphor cannot produce green to yellow light from light received from this LED. In the present invention, it is necessary to use a phosphor which produces blue light from ultraviolet to violet light received from the LED.

As the blue phosphor used in the white LED of the present invention, any phosphor material may be used as long as the phosphor absorbs ultraviolet to violet light in the range of 350 nm to 420 nm and emits blue light. Mixed white light can be emitted from a light emitting device by using the blue phosphor that emits blue light and the YAG-based phosphor that absorbs a part of the emitted blue light and converts it to green to yellow light. As the blue phosphor, a europium activated alkaline earth halophosphate phosphor ((Sr, Ba, Ca)$_5$(PO$_4$)$_3$Cl:Eu) or a europium activated alkaline earth aluminate phosphor (BaMg$_2$Al$_{16}$O$_{27}$:Eu) or the like can be used, for example.

For the blue phosphor of the present invention, if the emission intensity of the white LED is considered, it is desirable to use, among the above blue phosphors, a blue phosphor that emits light as brightly as possible upon being excited by ultraviolet to violet light and has a good match with an excitation spectrum of a YAG-based phosphor. From such a viewpoint, it is preferable to use a europium activated alkaline earth halophosphate phosphor having the following composition:

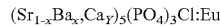

$(Sr_{1-x}Ba_xCa_y)_5(PO_4)_3Cl:Eu$

Among the phosphors having this composition, in the excitation spectrum of the YAG phosphor, the wavelength range of the blue light which exhibits an absorption rate at a maximum value or 95% or greater of the maximum value is from 430 nm to 480 nm, and the composition satisfies this wavelength range if $0 \le x \le 0.44$, $0 \le y \le 0.1$. Herein, y may be in the range $0 \le y \le 0.01$.

In the excitation spectrum of the YAG phosphor, the wavelength range of the blue light which exhibits an absorption rate of a maximum value or 99% or greater of the maximum value is from 440 nm to 470 nm, and the composition is capable of emitting this blue light when $0 \le x \le 0.35$ and $0 \le y \le 0.1$. Herein, y may be in the range $0 \le y \le 0.01$.

In the composition formula of the europium activated alkaline earth halophosphate phosphor, if the composition of Ca is $0 \le y \le 0.1$, the emission peak wavelength is shifted to the longer wavelength side as the ratio of the Ba element to the Sr element is increased. When x=0, the emission peak wavelength is 430 nm. In the composition wherein x=0.35, the emission peak wavelength is 470 nm, and in the composition wherein x=0.44, the emission peak wavelength moves to 480 nm. When x exceeds 0.44, the emission peak wavelength moves to a wavelength longer than 480 nm, but when x reaches 0.5, the emission peak wavelength is 485 nm, and even if x is increased beyond this, the peak wavelength remains at 485 nm. In addition, when x exceeds 0.44, the amount of the blue light component in the emission spectrum decreases and an amount of excitation energy for the YAG phosphor becomes insufficient, which is not preferable.

The emission spectra of the europium activated alkaline earth halophosphate phosphor are shown in FIG. 3 by curves 5 to 7 respectively corresponding to emission peak wavelengths of 440 nm, 455 nm, and 485 nm. In FIG. 3, the chemical compositions corresponding to the emission spectra shown by curves 5 to 7 are $(Sr_{0.86}Ba_{0.14})_5(PO_4)_3Cl:Eu$, $(Sr_{0.70}Ba_{0.30})_5(PO_4)_3Cl:Eu$, $(Sr_{0.45}Ba_{0.55})_5(PO_4)_3Cl:Eu$, respectively.

(Blue Light Emitting Phosphor Mixture)

For the blue fluorescent film, two or more kinds of phosphors having different emission peak wavelengths may be mixed and used. Mixing and using a plurality of kinds of phosphors makes the emission spectrum shape broader, and has an effect of improving the color rendering, compared to use of a single phosphor. In this case, although the effect on the average color rendering index (Ra) is subtle, it is still possible to improve the special color rendering index ($R_9$ to $R_{15}$).

In the mixed blue fluorescent film of the present invention, two kinds of phosphor, namely a phosphor (a first blue phosphor) having an emission peak wavelength in the range of 430 nm to 470 nm and a phosphor having an emission peak wavelength in the range of over 470 nm to 485 nm (a second blue phosphor), can be mixed and used. A specific example of a usable phosphor is a europium activated aluminate phosphor having an emission peak wavelength of about 450 nm. However, since the emission peak wavelength of this phosphor is not present in the range of a wavelength longer than 470 nm to 485 nm, it is necessary to use a phosphor having a different composition for the blue phosphor having the long wavelength component. On the other hand, in the case of using a europium activated alkaline earth halophosphate, since the emission peak wavelength of this phosphor can be any value within the range of 430 nm to 485 nm, it is also possible to select and use a plurality of phosphors of the same kind in accordance with mixing conditions. When a europium activated alkaline earth halophosphate phosphor of a single kind is used for the blue phosphor, the usable peak wavelength is in the range of 430 nm to 480 nm; on the other hand, when two or more kinds are mixed as a hybrid phosphor, the range is from 430 nm to 485 nm, and the upper limit value can be expanded. This is because the larger the upper limit value is, the greater the effect in improving the color rendering becomes. However, as can be seen from the spectrum changes shown in FIG. 3, for the case of the europium activated alkaline earth halophosphate phosphor, as the peak wavelength shifts to a longer wavelength, the spectral curve becomes broader and the emission intensity tends to decrease. For this reason, from the viewpoint of maintaining the overall light emission intensity, it is necessary to suppress the mixing ratio of components having emission peaks on the longer wavelength side to a certain value or less. As a specific mixing ratio, it is desirable that the first blue phosphor having an emission peak in the range of 430 nm to 470 nm is 50 parts or more by weight of the entire blue light emitting phosphor, and the second blue phosphor having an emission peak in the range of a wavelength longer than 470 nm to 485 nm is 50 wt %; or less of the entire blue light emitting phosphor.

(Other Phosphors)

For the white LED of the present invention, in addition to the blue phosphor and the green to yellow phosphor, phosphors of various luminescent colors may be mixed to use. In particular, the red light emitting phosphor is one of the three primary color components of blue, green and red that constitute white light, and is a phosphor indispensable for obtaining white light having a particularly low color temperature. As the red phosphor, it is desirable to use a phosphor such as a europium activated strontium sialon phosphor $(Sr_2Si_7Al_3ONi_3:Eu)$ and a europium activated alkaline earth nitridoaluminino silicate phosphor $((Sr, Ca)AlSiN_3:Eu)$. For the purpose of further improving the color rendering property, a manganese activated magnesium fluorogermanate phosphor $(\alpha MgO.\beta MgF_2.(Ge, Mn)O_2)$, which emits deep red light, may be added.

(LED Module)

In the white LED of the present invention, the phosphors are mixed with a resin material and used in the form of a fluorescent film. By directly or indirectly covering the periphery of the LED chip with the fluorescent film, the primary light emitted from the LED is converted into secondary light (white light) by the fluorescent film and emitted outside the device. The resin material to be used is not particularly limited as long as it is a transparent material. However, when an ultraviolet LED is used as the LED, it is desirable to use a silicone resin or the like having good anti-deterioration characteristics against ultraviolet light.

It is desirable to increase the film thickness of the fluorescent film. In the present invention, ultraviolet to violet LEDs are used as the LEDs, and it is necessary to prevent the direct light of the LED from leaking outside the light emitting device in consideration of the influence on human bodies, etc. To that end, it is necessary to prevent ultraviolet rays or the like from passing the fluorescent film by making the fluorescent film sufficiently thick. From such a viewpoint, the film thickness required for the fluorescent film is desirably 100 µm to 1000 µm. It is known that the brightness of the fluorescent film has an optimum film thickness at which the brightness becomes maximum, and the optimum film thickness is proportional to an average particle diameter of a phosphor of which the fluorescent film is a constituent. Therefore, the average particle diameter of the phosphor corresponding to the above-mentioned film thickness range is most preferably 10 µm to 50 µm.

The fluorescent film can be made of three to four kinds of phosphors, and herein, two of them, namely a YAG-based phosphor as a green to yellow phosphor and a blue phosphor, are indispensable materials. In particular, the blue phosphor of the present invention is not only used as a component of white light emission but also used as excitation light for the YAG phosphor; accordingly, a use amount of the blue phosphor is the largest. Table 1 below shows the changes in the use amount of the europium activated alkaline earth halophosphate $((Sr, Ba, Ca)_5(PO_4)_3Cl:Eu)$ as the blue phosphor in the case where the YAG phosphor $(Y_3Al_5O_{12}:Ce)$ in the present invention is used as a yellow to green phosphor and in the case where the europium activated alkaline earth orthosilicate phosphor $((Sr, Ba)_2SiO_4:Eu)$ in a conventional example is used a yellow to green phosphor.

A comparison was made as to how much of the blue phosphor is used in terms of a weight ratio with respect to each color temperature when the practical color temperature of white light is set to the range of 2500 K to 6500 K. In this case, for the case of white light of 6500 K, which is the highest color temperature, the use ratio of the blue phosphor is the highest, and in the white light of 2500 K having the lowest color temperature, the usage ratio of the blue phosphor is the lowest. Although in some cases a red phosphor or the like may be mixed and used to construct white light, Table 1 shows only the weight ratio between the blue phosphor and the green to yellow phosphor.

TABLE 1

| Color Temperature (K) | Phosphor Mixing Ratio (parts by weight) | | |
|---|---|---|---|
| | Blue phosphor $(Sr, Ba, Ca)_5(PO_4)_3Cl: Eu$ | Green to yellow phosphor $(Sr, Ba)_2SiO_4: Eu$ | Green to yellow phosphor $Y_3Al_5O_{12}: Ce$ |
| 2500 | 71 | — | 29 |
| | 62 | 38 | — |
| 6500 | 90 | — | 10 |
| | 83 | 17 | — |

As can be seen from Table 1, the mixing ratio between the blue phosphor to the green to yellow phosphor in the conventional white light source varies from approximately 6:4 to 8:2 by weight, whereas the mixing ratio varies from approximately 7:3 to 9:1 by weight in the present invention; thus, it can be understood that an amount of the blue phosphor in the white light source of the present invention is required to be about 10% larger by weight than that of the conventional white light source.

(Luminescent Characteristics)

Figure 4:
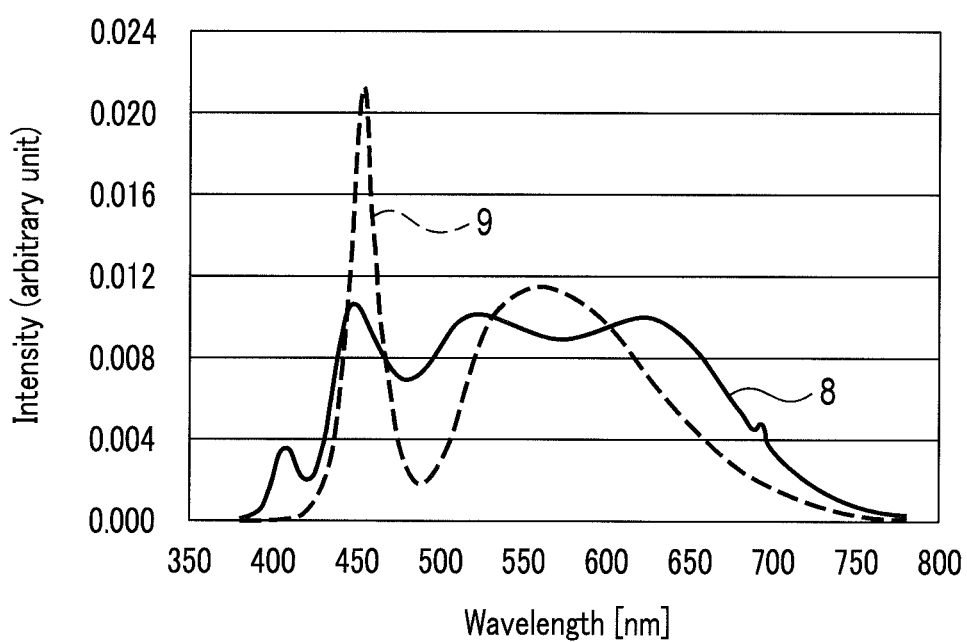
FIG. 4 is an emission spectrum of white light of 5000 K emitted from a white light source of the present invention.

Curve 8 in FIG. 4 is an example of the emission spectrum of white light obtained by the white LED of the present invention. This white light is realized by mixing a blue phosphor $((Sr, Ba, Ca)_5(PO_4)_3Cl:Eu)$, a yellow phosphor $(Y_3Al_5O_{12}:Ce)$, and a red phosphor $(CaAlSiN_3:Eu)$ at a predetermined ratio, and using the mixed phosphor in combination with an LED having an emission peak at 405 nm, so as to exhibit white light with a color temperature of 5000 K. As can be seen from FIG. 4, the emission spectrum of the white light source of the present invention is characterized by the continuous spectrum without interruption in the entire visible light range of 400 nm to 780 nm.

Since the white light obtained by the present invention can obtain a continuous spectrum in the entire visible light range, it has luminescent components required for natural white light without excess or deficiency, and when used as illumination light, it can exhibit high color rendering. The average color rendering index Ra of the white light of the present invention is 96 or higher. In addition, all of the color rendering indices R1 to R8 and the special color rendering indices R9 to R15 can be set to 85 or larger.

Furthermore, the white light of the present invention is characterized in that it does not exhibit an extremely sharp emission peak in the wavelength range of 400 nm to 500 nm. In curve 8 of FIG. 4, a slight uneven portion is observed in the wavelength range but the difference from the emission spectrum of the conventional white light source (curve 9 in FIG. 4) is remarkable. In a conventional white light source using a YAG-based phosphor, it is customary to use a YAG-based phosphor in combination with a blue LED in order to excite the YAG-based phosphor. For this reason, in the emission spectrum of the conventional white light source, there is an extremely uneven portion consisting of at least two emission peaks, one of the YAG phosphor having the peak in the yellow wavelength range in the vicinity of 570 nm and the other of the sharp light emission of the LED having the peak in the blue wavelength range in the vicinity of 450 nm.

Quantitative comparison on the white light of the present invention and the conventional example reveals the differences as will be described below. In order to clarify the differences, the maximum value is divided by the minimum value to obtain a value of (maximum value/minimum value) and concretely compare. The (maximum value/minimum value) is a ratio of a maximum value at an emission peak to a minimum value located in the longer wavelength side with respect to the maximal value, and the ratio was calculated with respect to the maximum emission peak present in the range of 400 nm to 500 nm. In curve 9 indicating the emission spectrum of the conventional example, the highest emission peak in the wavelength range of 400 nm to 500 nm is present in the vicinity of 450 nm, which is provided by the light emission of the blue LED. The ratio of the maximum value of this emission peak to the minimum value present on the long wavelength side of the maximum value was 10.5 (=0.021/0.002). On the other hand, in curve 8 of the present invention, the ratio was 1.57 (=0.011/0.007), which was a low numerical value of about ⅙ of the conventional light. Thus, it can be understood that there is a great difference in the emission peak shape in the blue wavelength range of the white light source between the present invention and the conventional white light source. The ratio of the light source of the present invention was calculated as follows. In curve 8, the maximum emission peak is present at a wavelength slightly shorter than 450 nm in the wavelength range of 400 nm to 500 nm. The above value of 1.57 is obtained by calculating the ratio of the maximum value of the emission peak to the minimum value adjacent to the long wavelength side of the maximum value. Although another emission peak is present in the vicinity of 405 nm in curve 8, the emission intensity is weak enough to ignore compared to the emission peak at the wavelength slightly shorter than 450 nm; therefore, this peak in the vicinity of 405 nm was excluded from the calculation target. Here, the minimum value may be a value present in a concave portion adjacent to a peak showing a maximum value, and the wavelength showing the minimum value may be a value within the wavelength range of 400 nm to 500 nm or may be in a range exceeding 500 nm.

In a conventional white LED using a blue LED, blue light from the LED is used for exciting a phosphor, and at the same time, a direct light from the blue LED itself is also used as the blue component of white light. However, when the direct light of the LED is used, it was only possible to obtain a white spectrum in a spectral shape having an emission peak in the blue wavelength range, because the blue light emitted from the LED concentrates on a specific wavelength and shows high emission intensity. In other words, it is difficult to eliminate an extreme peak like the one described above for a conventional LED white light source using a YAG-based phosphor.

The blue light component included in the white light emission spectrum is dependent also on the color temperature of the white light. For white light at a low color temperature, an amount of blue light component is relatively small, and for white light at a high color temperature, an amount of blue light component is relatively large. If an amount of the blue component increases, the emission intensity at the peak also increases; as a consequence, the above-mentioned unevenness in the emission peak, that is (maximum value/minimum value), increases as the color temperature of white light increases. Therefore, assuming that the range of practical color temperature is from 2500 K to 6500 K, (maximum value/minimum value) becomes minimum with white light at 2500 K, and becomes maximum with white light at 6500 K.

Figure 5:
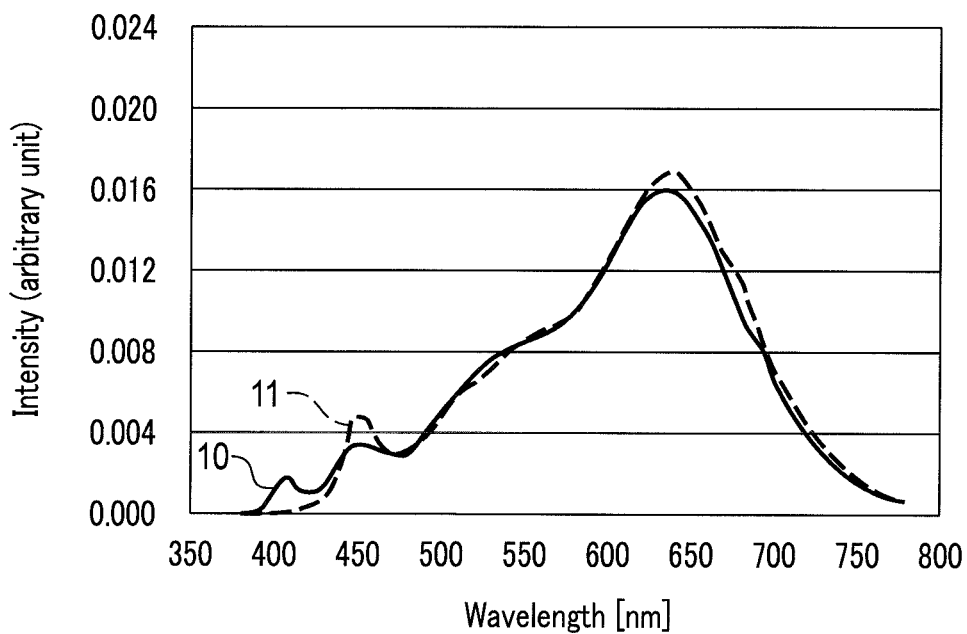
FIG. 5 is an emission spectrum of white light of 2500 K emitted from the white light source of the present invention.

To know the minimum of (maximum value/minimum value) in white light at 2500 K, the emission spectrum of the white light of the conventional example is shown as curve 11 in FIG. 5. In curve 11, the maximum emission peak in the wavelength range of 400 nm to 500 nm is provided by light in the vicinity of 450 nm emitted by the blue LED. The ratio of the maximum value of this emission peak to the minimum value present on the long wavelength side of the maximum value was 1.93 (=0.0054/0.0028). Therefore, the smallest value of (maximum value/minimum value) regarding the conventional white light is 1.93. The ratio in the present invention was calculated in a similar manner based on curve 10, and it was 1.17 (=0.0035/0.0030).

As described above, the ratios of (maximum value/minimum value) for white light at a color temperature of 2500 K and for white light at a color temperature of 5000 K were calculated. The ratio in the case of the conventional white light greatly varies from 1.9 to 10.5, whereas the ratio in the case of the white light of the present invention changes only slightly from 1.2 to 1.6. Since the change in the ratio of (maximum value/minimum value) in the white light of the present invention is thus very small even at 6500 K at which the color temperature becomes the maximum in practical use, the ratio did not show an extremely large value and did not exceed the minimum value of 1.9 in the white light of the conventional example. Therefore, there are no extreme peaks in concave and convex shapes in the blue light wavelength range in the white light of the present invention, and there are no emission peaks at which (maximum value/minimum value) is 1.9 or more in the wavelength range of 400 nm to 500 nm, which are observed in conventional white light. In other words, it is possible to realize a white light source that has an emission spectrum peak at which (maximum value/minimum value) is less than 1.9 in the wavelength range of 400 nm to 500 nm, or a white light source that does not have such an emission spectrum peak.

Herein, when the maximum value is A and the minimum value is B, the ratio X of the maximum value to the minimum value is expressed by the following (I):

$$X=A/B \quad (I)$$

The white light of the present invention makes use of the above-described characteristics because the light of the blue component is obtained by the light emission of the phosphor. Some blue phosphors show sharp emission similarly to LEDs, but there are various kinds of emission spectrum shapes. For example, if a phosphor having an emission spectrum with a flat-curved shape like a europium activated alkaline earth halophosphate phosphor is used, it is possible to prevent the appearance of a prominent emission peak in the blue wavelength range. In the white light source of the present invention, LED light emission is used as the excitation light source of the phosphor. Like the blue LED, the ultraviolet to violet LED used in the present invention also has a sharp emission peak in a specific wavelength range. However, in the white light source of the present invention, most of the LED emission is absorbed by the phosphor, and the LED direct light contained in the white light is small enough to ignore. Furthermore, the LED light emission of the present invention is in the color of ultraviolet to violet, has lower visibility compared to blue light, and is hardly perceived by human bodies.

Blue light is a luminescent component essential for constructing white light. A relatively strong emission intensity is required for white light at a high color temperature, and relatively weak emission intensity is required for white light at a low color temperature. Accordingly, although an amount of the blue component in white light is greatly dependent on a color temperature, the white light source of the present invention emits only blue light having an appropriate intensity required for each corresponding color temperature. However, in the conventional white light source, since there is a strong emission peak in the blue wavelength range, an excessive intensity exceeding the appropriate intensity is observed in the peak. Since the cells in the eyeball related to the circadian rhythm of the human body have high sensitivity to light in the blue wavelength range, if excessively strong light is present in the blue wavelength range, the cells are subjected to excessive stimulation.

Furthermore, blue light has the highest energy among the visible light components contained in white light. Blue light is a type of electromagnetic wave, and the energy of electromagnetic waves increases in proportion to the square of the frequency. When such blue light is incident on the eye, the light reaches the cornea covering the eyeball; therefore, viewing such blue light for a long time causes eyestrain. Research results have shown that blue light in the wavelength range of 400 nm to 500 nm damages the retina.

As described above, it is desirable that the blue light that gives various adverse effects to the human bodies is reduced as much as possible in the components constituting white light. However, with conventional white light using a blue LED, it is difficult to exclude strong blue light emitted from the LED to the level where the human bodies are not affected; in the reality, measures are taken by using eyeglasses and filters, etc., rather than doing something to the light source itself. On the other hand, the white light source of the present invention can reduce the intensity of the blue light component to the minimum level required for the white light at a predetermined color temperature, and measures are taken in the white light source itself so that human body-friendly white light can be provided.

The white LED of the present invention is characterized in that at least a YAG-based phosphor is used in a green to yellow phosphor. A europium activated alkaline earth orthosilicate phosphor which is used for a conventional white LED is an excellent phosphor having the same emission intensity as a YAG-based phosphor. However, conventional phosphors are weak against environmental changes such as heat and moisture, and their emission intensity is susceptible to deterioration. Therefore, when an LED module using a conventional phosphor is lit, although it emits light brightly at the initial stage of lighting, the emission intensity tends to gradually degrade during continuous lighting. When this conventional LED is continuously lit, Joule heat is generated from the LED itself, and the temperature of the LED module rises to about 100° C. In addition, since moisture is present in the air under constant humidity, the emission intensity of the phosphor changes as time passes under the influence of both heat and moisture.

Generally, the emission intensity of a phosphor material gradually decreases when the material is caused to emit light continuously for a long time. The luminance lowering phenomenon as described above is a natural phenomenon, and the reduction in the emission intensity is an inevitable characteristic of a phosphor material. However, in some materials, the degree of luminance reduction is less prominent. YAG is representative of such materials. YAG has a garnet structure and is a material showing excellent heat resistance and corrosion resistance. Accordingly, a phosphor containing YAG as a host material also has an advantage in prevention of the luminance reduction during lighting as compared to other green to yellow phosphors (for example, a europium activated alkaline earth orthosilicate phosphor).

Figure 6:
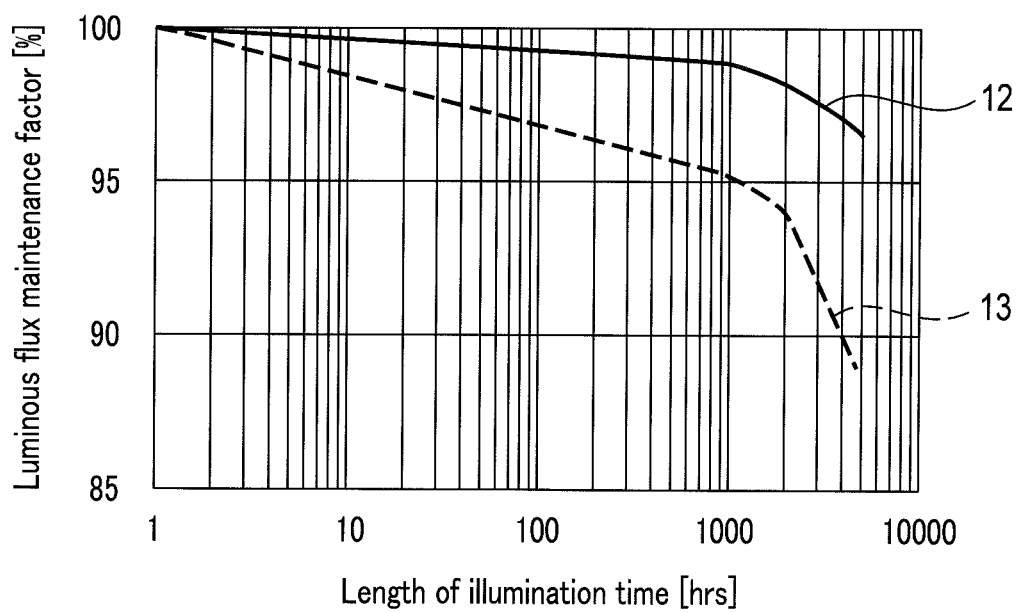
FIG. 6 shows luminous flux maintenance factor curves of green to yellow phosphors.

FIG. 6 shows the curves representing the luminous flux maintenance factor of the green to yellow phosphors. Curve 12 in FIG. 6 represents the luminous flux maintenance factor of the YAG phosphor, and curve 13 represents the luminous flux maintenance factor of the europium activated orthosilicate phosphor. These curves are obtained by plotting the changes in emission intensity of an LED module measured by a total luminous flux measuring device, when the LED module is obtained by covering the periphery of an LED with each single fluorescent film. Both curves are standardized with the total luminous flux at the initial stage of lighting as 100% in order to make it easy to compare the difference in luminous flux maintenance factor. Comparing both curves, the luminous flux maintenance factor of the YAG phosphor consistently exceeds the luminous flux maintenance factor of the europium activated orthosilicate phosphor, and the difference tends to become greater as time elapses. The luminous flux maintenance factor of the YAG phosphor is 99.8% after 1000 hours and 96.5% after 5000 hours, whereas the luminous flux maintenance factor of the europium activated orthosilicate phosphor is 95.2% after 1000 hours, and 88.7% after 5000 hours.

As described above, the YAG phosphor has an excellent luminous flux maintenance factor, and by using the YAG phosphor as an essential material of the green to yellow light component, white light emission with excellent luminous flux maintenance factor can be obtained in the white light source of the present invention. In the white light source of the present invention, the use of the YAG phosphor alone can of course provide excellent characteristics of a green to yellow phosphor, but even the use of similar a small amount of YAG phosphor can provide effects in improvement of the luminous flux maintenance factor; therefore, it is possible to mix the YAG phosphor with a conventional green to yellow phosphor. Furthermore, the excellent light emission characteristics of the YAG phosphor are realized by its garnet crystal structure, and even if trace amounts of additives are contained in the constituent elements of the basic composition $Y_3Al_5O_{12}$, the same effect can be exerted.

An example of an LED module is shown in FIGS. 7 to 12.

In an LED module 50, as shown in FIG. 7 for example, a large number of LED chips 52 are linearly arranged on a substrate 51. The number of chip rows can be one or more. A plurality of chip rows can be arranged according to the number of chips used. For example, in FIG. 7, a plurality of chip rows are arranged in a matrix. Although it is preferable to arrange the LED chips 52 with high density as much as possible, mutual absorption of the LED light emission occurs if the LED chips 52 are arranged too close to each other. It is thus preferable to arrange the LED chips 52 at an appropriate interval for this reason and for encouraging the LED chips 52 to dissipate heat generated from the LED chips 52 during continuous lighting. Incidentally, the arrangement of the chips is not limited to a linear pattern, and a staggered pattern or the like can also similarly achieve a high density arrangement.

In FIG. 7, the LED chips 52 are coupled by wires 53 and are coupled to electrodes 54. The electrode 54 has a specific pattern and also serves as a conductive portion on the substrate 51. It is desirable to use at least one kind of metal selected from Ag, Pt, Ru, Pd, Al, etc., as the material of the conductive portion. On the surface of the metal, it is desirable that an Au film is formed for the purpose of preventing corrosion or the like. The Au film may be formed by any of a printing method, a vapor deposition method, or a plating method.

Figure 10:
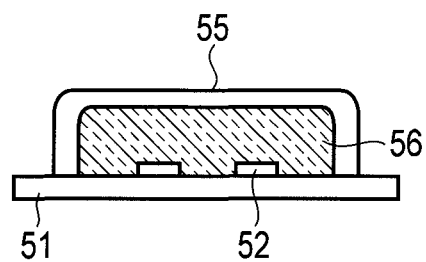
FIG. 10 is a cross-sectional view showing a third example of the LED module used for the white light source.
Figure 11:
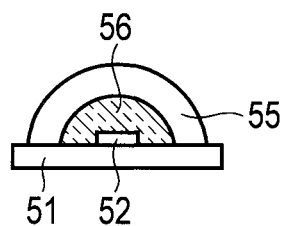
FIG. 11 is a cross-sectional view showing a fourth example of the LED module used for the white light source.
Figure 12:
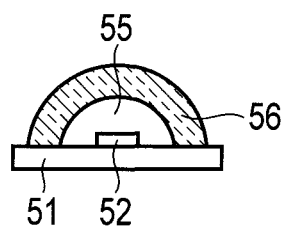
FIG. 12 is a cross-sectional view showing a fifth example of the LED module used for the white light source.

The LED chips 52 on the substrate 51 are directly or indirectly covered with a phosphor layer 55. Examples of arrangement of the phosphor layer 55 are shown in FIGS. 8 to 12. As shown in FIG. 8, the phosphor layer 55 may be formed directly on the surfaces of the LED chips 52. As shown in FIG. 9, after the LED chips 52 are covered with the phosphor layer 55, the phosphor layer may be covered with a transparent resin layer 56. As shown in FIG. 10, after covering the surfaces of the LED chips 52 with the transparent resin layer 56, substantially the entire surface of the transparent resin layer 56 may be covered with the phosphor layer 55. Furthermore, in the examples shown in FIGS. 8 to 10, the plurality of LED chips 52 are covered with a single phosphor layer 55 or a transparent resin layer 56. However, as shown in FIGS. 11 and 12, a single LED chip 52 may be covered with a single phosphor layer 55 or a single transparent resin layer 56. Furthermore, as one application example, a lamination structure may be adopted; specifically, a single LED chip or a plurality of LED chips are covered with a transparent resin layer, a phosphor layer is formed on the transparent resin layer, and another transparent resin layer is formed on the phosphor layer.

EXAMPLES

The white LED according to the present invention will be described below in detail using examples. For the phosphor materials used in the white LEDs of the following examples and comparative examples, any one of the following ten kinds of phosphor is used, and in the following description, each phosphor is distinguished by a color of light emitted from the phosphor and by the number shown below, not by its name or its chemical composition (for example, an alkaline earth halophosphate phosphor, $(Sr_{0.69}Ba_{0.31})_5(PO_4)_3Cl:Eu$, will be referred to as "blue phosphor (2)").

(Blue Phosphors)

(1) Alkaline earth halophosphate $((Sr_{0.86}Ba_{0.14})_5(PO_4)_3Cl:Eu)$, emission peak wavelength is 450 nm (2) Alkaline earth halophosphate $((Sr_{0.69}Ba_{0.305}Ca_{0.005})_5(PO_4)_3Cl:Eu)$, emission peak wavelength is 465 nm (3) Alkaline earth aluminate $(BaMg_2Al_{16}O_{27}:Eu)$, emission peak wavelength is 450 nm (Green to Yellow Phosphors)

(4) YAG $(Y_{0.98}Ce_{0.02})_3Al_5O_{12}$, emission peak wavelength is 558 nm (5) YAG-based $(Y_{0.97573}Ce_{0.024}Sr_{0.00017}Hf_{0.0001})_3(Al_{0.9992}Mg_{0.0004}Si_{0.0004})_5O_{12}$, emission peak wavelength is 555 nm (6) Alkaline earth orthosilicate $(Sr, Ba)_2SiO_4:Eu$, emission peak wavelength is 548 nm (Red Phosphor)

(7) $CaAlSiN_3:Eu$, emission peak wavelength is 650 nm (Blue Phosphors)

(8) Alkaline earth halophosphate $(Sr_{0.54}Ba_{0.45}Ca_{0.01})_5(PO_4)_3Cl:Eu$, emission peak wavelength is 480 nm (9) Alkaline earth halophosphate $(Sr_{0.64}Ba_{0.35}Ca_{0.01})_5(PO_4)_3Cl:Eu$, emission peak wavelength is 470 nm

(10) Alkaline earth halophosphate $(Sr_{0.34}Ba_{0.65}Ca_{0.01})_5(PO_4)_3Cl:Eu$, emission peak wavelength is 485 nm Example 1

First, an LED module was made by combining an LED with three kinds of phosphor, a blue phosphor, a green to yellow phosphor, and a red phosphor. Thirty InGaN-based LED chips having an emission peak at 405 nm were prepared and arranged in a lattice pattern on an alumina substrate having a size of 15 mm×12 mm. Thereafter, the LED in which the LED chips were arrayed was covered entirely with the phosphors. The phosphors were mixed at a predetermined ratio as shown in Table 2 to make a mixed white phosphor that emits light at a color temperature of 5000 K, and this mixed white phosphor was used. For each of the phosphors, a powder having an average particle diameter in the range of 25 µm to 35 µm was used, and a slurry which is obtained by dispersing the three phosphors in a silicone resin, was applied on the LED chips, thereby making the module. The film thickness of the fluorescent film was about 700 µm. An electronic circuit was connected to the LED module thereby made in order to obtain a white LED of Example 1.

Comparative Example 1

A white LED of Comparative Example 1 was made. The components were the same as those used in Example 1, except for the green to yellow phosphor. In Example 1, the green to yellow phosphor (4) was used, whereas the green to yellow phosphor (6) was used in Comparative Example 1. A white light source was made by mixing the phosphors in a mixing ratio as shown in Table 2, so that white light has a color temperature of 5000 K. The average particle diameter of the green to yellow phosphor (6) used in this example was 30 µm, and the film thickness of the fluorescent film was about 670 µm.

After lighting the white light sources of Example 1 and Comparative Example 1 under the same conditions, the emission spectrum of the obtained white light was measured using a spectroscope (LE3400 manufactured by Hamamatsu Photonics K.K.). Next, after obtaining data of emission intensity at intervals of 5 nm over the wavelength range of 380 nm to 780 nm in the emission spectrum, the average color rendering index (Ra) was calculated according to the method described in JIS-8726. The white light source including an ultraviolet to violet LED is characterized by high color rendering, but as in Example 1 and Comparative Example 1, even when the type of yellow phosphor was different, the average color rendering index (Ra) of both examples was 98 or higher, and good results were obtained. Specific values are as shown in Table 2 below.

the yellow phosphor (6) used in Comparative Example 1, and the difference in intensity between all luminous fluxes after 1000 hours of lighting was reversed, and after 5000 hours, the intensity difference expanded to nearly 5%. As described above, in Example 1 and Comparative Example 1, a white LED was made by using an ultraviolet to violet LED and by different green to yellow phosphors, thereby obtaining white light having high color rendering in both

TABLE 2

| White LED | LED Light Emission Peak Wavelength | Phosphor Mixing Ratio (phosphor number, parts by weight) | | | | | | Color Temperature (K) | Ra |
|---|---|---|---|---|---|---|---|---|---|
| | | Blue | | Green to yellow | | Red | | | |
| Example 1 | 405 | 1 | 80 | 4 | 15 | 7 | 5 | 5025 | 98 |
| Comparative Example 1 | 405 | 1 | 73 | 6 | 20 | 7 | 7 | 5002 | 98 |

Subsequently, a continuous lighting test was performed on the two types of white LEDs of Example 1 and Comparative Example 1. Each white LED was placed in an oven (DKN402 made by Yamato Scientific Co., Ltd.), and a current of 210 mA was applied to each light source for a total of 5000 hours, while maintaining the internal temperature in the oven at 85±5° C. With respect to the two types of light sources, the light emission intensity was measured at the initial stage of lighting and after lighting for 1000 hours and 5000 hours, and the luminous flux maintenance factor was calculated. Regarding the light emission intensity of the light source, the light source after the initial lighting and lighting for a predetermined time was taken out from the oven and lighted under the conditions of an applied current of 210 mA and a substrate temperature of 25±1° C., and then the total luminous flux of the light source was measured using a LE3400 spectroscope manufactured by Hamamatsu Photonics K.K. The measurement results are shown in Table 3 below.

examples. Furthermore, in Example 1, excessive luminance deterioration was not caused even when the light source was continuously lit for a long time unlike the light source of Comparative Example 1, and white light having a high luminous flux maintenance factor and showing comprehensively excellent emission characteristics was obtained.

Examples 2 to 4 and Comparative Examples 2 to 4

Comparison of light emitting characteristics was performed for two types of light source: one consisting of the green to yellow phosphor (4), which is a YAG-based phosphor, and a blue LED; and the other consisting of the same phosphor and an ultraviolet to violet LED. Other than the phosphor and the LEDs, the other members used in those light sources and their configurations were the same as those in Example 1.

In Examples 2-4, a white LED was made by combining an InGaN-based ultraviolet to violet LED having an emission

TABLE 3

| White LED | Total Luminous Flux (Initial period) lm(%) | Total Luminous Flux (After 1000 hours) lm(%) | Total Luminous Flux (After 5000 hours) lm(%) |
|---|---|---|---|
| Example 1 | 550(100.0) | 539(98.0) | 534(97.1) |
| Comparative Example 1 | 560(100.0) | 538(96.1) | 510(91.1) |

The initial total luminous flux of the white LED of Example 1 was 550 lm (lumen), which was about 2% lower than the 560 lm (98.2%) in Comparative Example 1. It is estimated that this intensity difference was caused by a difference in light emission process. The yellow phosphor (6) of Comparative Example 1 emitted light upon receiving direct light from the LED, whereas the yellow phosphor (4) of Example 1 emitted yellow light upon receiving light from the blue phosphor (1) upon receiving direct light from the LED. In other words, the yellow component of the white light source of Example 1 was obtained through a two-step excitation process in which ultraviolet light was converted to blue light and blue light was converted to yellow light, and the total energy loss increased in Example 1 compared to Comparative Example 1 as a result of adding one step to the excitation process in Example 1. However, the yellow phosphor (4) used in Example 1 had better luminance deterioration characteristics during the continuous use than peak at 405 nm with the blue phosphor (1), the green to yellow phosphor (4), and the red phosphor (7). As shown in Table 4, the mixing ratio of the phosphors were changed so as to obtain three types of white LEDs respectively having color temperatures of 2500 K, 4000 K, and 6500 K. For the phosphors, powder materials having an average particle diameter of 35 to 45 µm were used, and the thickness of the fluorescent film was adjusted to 700 to 900 µm. The mixing ratio of the green to yellow phosphor and the blue phosphor (a mixed amount of the green to yellow phosphor:a mixed amount of the blue phosphor) was 26:74 in Example 2, 20:80 in Example 3, and 10:90 in Example 4 according to the values shown in Table 5 below.

In Comparative Examples 2-4, a white LED was made by combining an InGaN-based blue LED having an emission peak at 450 nm with the green to yellow phosphor (4) and the red phosphor (7). The color temperatures of the white light in Comparative Examples 2 to 4 were similar to those in Examples 2-4; on the other hand, the mixing ratio of the phosphors in each white LED was as shown in Table 4. The same materials as those in Examples 2-4 were used for the green to yellow phosphor and the red phosphor, the average particle diameter was the same as in Examples 2-4, and the film thickness was substantially the same as in Examples 2-4.

the white light source of Comparative Example 1, Ra and (maximum value/minimum value) were good, but the luminous flux maintenance factor was poor. In the white light sources of Comparative Examples 2-4, the luminous flux maintenance factor was excellent, but only unsatisfactory results were obtained with respect to the other two characteristics. In summary, the white light sources of Examples

TABLE 4

| White LED | LED Light Emission Peak Wavelength | Phosphor Mixing Ratio (phosphor number, parts by weight) | | | | | | Color Temperature (K) |
|---|---|---|---|---|---|---|---|---|
| | | Blue | | Green to yellow | | Red | | |
| Example 2 | 405 | 1 | 66 | 4 | 24 | 7 | 10 | 2497 |
| Example 3 | 405 | 1 | 74 | 4 | 19 | 7 | 7 | 4030 |
| Example 4 | 405 | 1 | 88 | 4 | 10 | 7 | 2 | 6542 |
| Comparative Example 2 | 450 | — | — | 4 | 81 | 7 | 19 | 2502 |
| Comparative Example 3 | 450 | — | — | 4 | 83 | 7 | 17 | 3999 |
| Comparative Example 4 | 450 | — | — | 4 | 87 | 7 | 13 | 6464 |

Various light emission characteristics of the white light sources of Examples 2-4 and Comparative Examples 2-4 were measured. The results are shown in Table 5 below. The table also shows the light emission characteristics of the white light sources of Example 1 and Comparative Example 1 for comparison. The (maximum value/minimum value) in the table below is a ratio of a maximum value at an emission peak to a minimum value located in the longer wavelength side with respect to the maximum value, and the ratio is calculated with respect to the maximum emission peak present in the range of 400 nm to 500 nm in the white light emission spectrum. The luminous flux maintenance factor is a value in percentage obtained by dividing the total luminous flux at the time of initial lighting by the total luminous flux after continuous lighting.

1-4 can have not only excellent color rendering but also light emission characteristics with improved luminous flux maintenance factor. Since (maximum value/minimum value) is smaller than 1.9 in each of Examples 1-4, it was possible to obtain a human-friendly light source that did not have a light emission peak prominent in the blue wavelength range and that greatly reduced problems such as blue light hazard.

In addition, the white light sources of Examples 1-4 were excellent not only in the average color rendering index Ra but also in all of the color rendering indices R1 to R8 and the special color rendering indices R9 to R15. Specific characteristics of Examples 1 to 4 are shown together with those of Comparative Example 4. As can be seen from the table below, the white light sources of Examples 1-4 showed excellent color rendering, i.e., 85 or larger in all of R1 to

TABLE 5

| | | | Luminous Flux Maintenance Factor (%) | |
|---|---|---|---|---|
| White LED | Ra | Maximum value/Minimum value (400~500 nm) | 0 hr/ 1000 hr | 0 hr/ 5000 hr |
| Example 1 | 98 | 1.57 | 98.0 | 97.1 |
| Example 2 | 96 | 1.71 | 97.4 | 96.3 |
| Example 3 | 99 | 1.63 | 98.2 | 97.0 |
| Example 4 | 96 | 1.82 | 97.9 | 96.8 |
| Comparative Example 1 | 98 | 1.40 | 96.1 | 91.2 |
| Comparative Example 2 | 93 | 2.06 | 98.4 | 97.3 |
| Comparative Example 3 | 91 | 7.73 | 99.1 | 98.2 |
| Comparative Example 4 | 85 | 9.50 | 99.3 | 98.2 |

As can be understood from the light emission characteristics shown in Table 5, only the white light sources of Examples 1 to 4 were able to exhibit satisfactory characteristics with all three characteristics (Ra, (maximum value/minimum value), and luminous flux maintenance factor). In R15, whereas the white light source of Comparative Example 4 had large variations in the color rendering indices. For example, some indices, like R1 and R15, were higher than 90, but some indices, like R10 and R12, were extremely low.

TABLE 6

| White LED | Ra | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|
| Example 1 | 98 | 100 | 98 | 96 | 96 | 98 | 98 | 96 | 98 | 88 | 94 | 93 | 95 | 99 | 96 | 97 |
| Example 2 | 96 | 98 | 98 | 92 | 92 | 98 | 99 | 96 | 96 | 88 | 94 | 88 | 92 | 98 | 94 | 98 |
| Example 3 | 99 | 99 | 99 | 97 | 98 | 100 | 99 | 100 | 99 | 96 | 97 | 95 | 87 | 99 | 98 | 98 |
| Example 4 | 96 | 98 | 97 | 93 | 92 | 99 | 95 | 95 | 97 | 95 | 93 | 88 | 85 | 99 | 96 | 99 |
| Comparative Example 4 | 85 | 90 | 85 | 77 | 85 | 89 | 79 | 86 | 89 | 74 | 63 | 86 | 58 | 88 | 87 | 91 |

Examples 5 to 9 and Comparative Examples 5 to 6

White LEDs were made by using different types of LEDs, different kinds of phosphor having different compositions, and different mixing ratios of the phosphors. However, the color temperature of white light was adjusted to be about 5000 K, so that the luminescence intensity and color rendering characteristics could be compared more strictly. Further, the average particle diameter of each of the phosphors used in the white LEDs was in the range of 15 μm to 25 μm, and the film thickness of the fluorescent film was adjusted to fall within the range of 250 μm to 450 μm. Example 8 is an example in which multiple kinds of green to yellow phosphor were used, and the mixing ratio of the YAG-based phosphor among the green to yellow phosphors was 54 wt %.

TABLE 8

| White LED | Ra | Maximum value/Minimum value (400~500 nm) | Luminous Flux Maintenance Factor (%) 0 hr/500 hr | 0 hr/1000 hr |
|---|---|---|---|---|
| Example 5 | 98 | 1.52 | 98.2 | 96.4 |
| Example 6 | 96 | 1.84 | 97.0 | 96.2 |
| Example 7 | 98 | 1.56 | 98.1 | 97.4 |
| Example 8 | 98 | 1.48 | 96.8 | 95.4 |
| Example 9 | 98 | 1.56 | 98.1 | 96.9 |
| Comparative Example 5 | 91 | 2.11 | 98.2 | 96.3 |
| Comparative Example 6 | 85 | 1.04 | 98.0 | 97.1 |

TABLE 7

| White LED | LED Light Emission Peak Wavelength | Phosphor Mixing Ratio (phosphor number, parts by weight) | | | | | | Color Temperature (K) |
|---|---|---|---|---|---|---|---|---|
| | | Blue | | Green to yellow | | Red | | |
| Example 5 | 405 | 2 | 84 | 4 | 12 | 7 | 4 | 5054 |
| Example 6 | 405 | 3 | 79 | 4 | 16 | 7 | 5 | 4988 |
| Example 7 | 405 | 1 | 80 | 5 | 15 | 7 | 5 | 5008 |
| Example 8 | 405 | 1 | 81 | 4 | 7 | 7 | 6 | 5021 |
| | | | | 6 | 6 | | | |
| Example 9 | 400 | 1 | 80 | 4 | 15 | 7 | 5 | 5052 |
| Comparative Example 5 | 405 | 1 | 95 | 4 | 2 | 7 | 3 | 5033 − 0.01 duv |
| Comparative Example 6 | 405 | 1 | 55 | 4 | 16 | 7 | 29 | 5029 + 0.01 duv |

Among the white light sources listed in Table 7, the phosphors of the same types as those in Example were used in Comparative Example 5 and Comparative Example 6, but the mixing ratio of the phosphors was different. In the light sources of Comparative Examples 5 and 6, since the mixing ratio of the used blue phosphor was out of the proper range, the color temperature of the obtained white light deviated from the locus of the blackbody radiation and proper white light could not be obtained. Specifically, since the mixed amount of the blue phosphor is too much in the light source of Comparative Example 5, the white light was too bluish, and since the mixed amount of the blue phosphor is too small in the light source of Comparative Example 6, the white light was too yellowish; thus, in both cases, the characteristics were not what is substantially called white light.

The emission characteristics of each white LED made under the conditions shown in Table 7 were evaluated. The results are shown in Table 8 below.

Since all the light sources use an ultraviolet to violet LED, none of the light sources showed extremely a high value of (maximum value/minimum value). However, since the mixing ratio of the blue phosphor exceeded an appropriate amount, and the (maximum value/minimum value) exceeded 1.9 in Comparative Example 5, an emission peak of the light source of this example was present in the blue wavelength range, which resulted in a less than ideal light source. The green to yellow phosphors of various compositions were used in the examples but all of those phosphors were the YAG-based phosphors; thus, there is no problem with the luminous flux maintenance factor of each of the light sources.

Each of the white light sources of the examples had an index Ra of 96 or higher and showed excellent color rendering. On the other hand, only insufficient color rendering was obtained in the light source of the comparative examples, because the mixture ratio of the phosphors was biased in the comparative examples. In the light source of Example 8, a mixture of the phosphor (4) and the phosphor (6) was used as the green to yellow phosphor. This light source was made in expectation of two effects: an effect of use of the phosphor (4) for improvement in the luminous flux maintenance factor; and an effect of use of the phosphor (6) for improvement in color rendering. The light source exhibited a luminous flux maintenance factor at approximately the same level as the light source using the YAG-based phosphor (4) or the YAG-based phosphor (5) alone. The light source exhibited effects of improvement in color rendering as compared with the light source of Example 7, as shown in the table below.

TABLE 9

| White LED | Ra | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|
| Example 7 | 98 | 97 | 98 | 97 | 97 | 98 | 99 | 100 | 99 | 87 | 94 | 89 | 85 | 99 | 96 | 97 |
| Example 8 | 98 | 96 | 99 | 98 | 95 | 96 | 96 | 100 | 97 | 93 | 97 | 91 | 95 | 96 | 98 | 97 |

For the light sources of Examples 7 and 8, the average color rendering index Ra was of the same value of 98, but R1 to R15 of the light source of Example 7 were all 85 or higher, whereas R1 to R15 in Example 8 were all 90 or higher; thus, improved characteristics were obtained in Example 8. Large differences between these two examples particularly in R9 and R12 are due to the fact that the phosphor (6) used as a green to yellow phosphor suitably contains emission spectral components corresponding to R9 and R12.

Examples 10 to 16

First, an LED module was made by combining an LED with a phosphor consisting of three kinds of phosphor, namely a blue phosphor, a yellow phosphor, and a red phosphor. However, the color temperature of white light in each of the examples was adjusted to be about 5000 K as shown in Table 10, so that the emission intensity and color rendering characteristics could be compared more strictly. In Table 10, under each of the items "blue", "yellow", and "red", the left column shows the numbers that indicate the kinds of each phosphor, and the right column shows the proportions (wt %) of each phosphor to the total weight of the mixed phosphor. In Examples 10 to 16, two kinds of blue phosphor were used. The proportion of each of the two kinds of blue phosphor to the total weight is shown in the brackets in the right column. Two kinds of yellow phosphor were used in the LED module of Example 16. The proportion of the YAG-based phosphor to the total weight of the two kinds of yellow phosphor was 55 wt %.

The average particle size of each phosphor particle was in the range of 10 μm to 25 μm. For the LED, InGaN-based LED chips having an emission peak at 405 nm were used.

An LED module was made in the same manner as in Example 1 by using the phosphor particles mixed at the ratio shown in Table 10 and LED chips. The film thickness of the fluorescent film was adjusted so as to fall within the range of 200 μm to 450 μm. An electronic circuit was connected to the LED module thereby made in order to obtain white LEDs of Examples 10-16.

The mixing ratio of the cerium activated yttrium aluminum garnet-based phosphor and the europium activated alkaline earth halophosphate phosphor (a mixed amount of the cerium activated yttrium aluminum garnet-based phosphor G1:a mixed amount G2 of the europium activated alkaline earth halophosphate phosphor) was 13:87 parts by weight in Example 10, 10:90 parts by weight in Example 11, 8:92 parts by weight in Example 12, 13:87 parts by weight in Example 13, and 13:87 parts by weight in Example 14, according to the values shown in Table 10.

TABLE 10

| | LED Light Emission Peak Wavelength (nm) | Phosphor Mixing Ratio (wt %) | | | | | | Color Temperature (K) |
|---|---|---|---|---|---|---|---|---|
| | | Blue | | Yellow | | Red | | |
| Example 10 | 405 | 1 | 59 (73 wt %) | 5 | 12 | 7 | 7 | 5023 |
| | | 8 | 22 (27 wt %) | | | | | |
| Example 11 | 405 | 1 | 48 (57 wt %) | 5 | 9 | 7 | 6 | 5055 |
| | | 8 | 36 (43 wt %) | | | | | |
| Example 12 | 405 | 1 | 41 (47 wt %) | 5 | 8 | 7 | 5 | 5012 |
| | | 8 | 46 (53 wt %) | | | | | |
| Example 13 | 405 | 1 | 57 (70 wt %) | 5 | 12 | 7 | 7 | 5045 |
| | | 9 | 24 (30 wt %) | | | | | |
| Example 14 | 405 | 1 | 59 (73 wt %) | 5 | 12 | 7 | 7 | 5023 |
| | | 10 | 22 (27 wt %) | | | | | |
| Example 15 | 405 | 3 | 45 (52 wt %) | 5 | 7 | 7 | 6 | 4980 |
| | | 8 | 42 (48 wt %) | | | | | |
| Example 16 | 405 | 1 | 60 (74 wt %) | 5 | 6 | 7 | 7 | 5071 |
| | | 8 | 21 (26 wt %) | 6 | 5 | | | |
| Example 7 | 405 | 1 | 80 | 5 | 15 | 7 | 5 | 5008 |
| Comparative Example 4 | 450 | — | — | 4 | 87 | 7 | 13 | 6464 |

Various characteristics (average color rendering index, (maximum value/minimum value), luminous flux maintenance factor, special color rendering index, etc.) of the obtained white LEDs were measured under the same conditions as in Example 1 and summarized in Tables 11 and 12. In the tables, characteristics of the white LEDs made in Example 7 and Comparative Example 4 are also described as a reference for comparison of characteristics.

TABLE 11

| | Ra | Maximum value/ Minimum value (400~500 nm) | Luminous Flux Maintenance Factor (%) | |
|---|---|---|---|---|
| | | | 1000 hrs/ 0 hrs | 5000 hrs/0 hrs |
| Example 10 | 98 | 1.47 | 97.5 | 96.2 |
| Example 11 | 98 | 1.43 | 98.1 | 96.3 |
| Example 12 | 97 | 1.39 | 97.9 | 97.1 |
| Example 13 | 98 | 1.46 | 97.9 | 97.5 |
| Example 14 | 98 | 1.48 | 98.0 | 97.5 |
| Example 15 | 97 | 1.56 | 97.5 | 96.1 |
| Example 16 | 98 | 1.39 | 97.2 | 96.3 |
| Example 7 | 98 | 1.56 | 98.1 | 97.4 |
| Comparative Example 4 | 85 | 9.50 | 99.3 | 98.2 |

TABLE 12

| | Ra | R1 | R2 | R3 | R4 | R5 | R6 | R7 | R8 | R9 | R10 | R11 | R12 | R13 | R14 | R15 |
|---|---|---|---|---|---|---|---|---|---|---|---|---|---|---|---|---|
| Example 10 | 98 | 99 | 99 | 97 | 96 | 99 | 98 | 98 | 98 | 95 | 98 | 93 | 95 | 99 | 98 | 99 |
| Example 11 | 98 | 97 | 99 | 98 | 95 | 97 | 98 | 99 | 99 | 96 | 99 | 92 | 96 | 98 | 98 | 98 |
| Example 12 | 97 | 96 | 99 | 98 | 94 | 96 | 97 | 99 | 98 | 95 | 97 | 90 | 97 | 96 | 98 | 97 |
| Example 13 | 98 | 99 | 99 | 97 | 96 | 99 | 98 | 98 | 98 | 95 | 99 | 93 | 95 | 99 | 98 | 99 |
| Example 14 | 98 | 99 | 99 | 97 | 96 | 99 | 98 | 98 | 98 | 95 | 98 | 93 | 94 | 99 | 98 | 99 |
| Example 15 | 97 | 99 | 98 | 94 | 95 | 100 | 97 | 97 | 99 | 98 | 94 | 93 | 86 | 99 | 96 | 99 |
| Example 16 | 98 | 97 | 100 | 97 | 95 | 98 | 99 | 98 | 98 | 98 | 99 | 95 | 95 | 98 | 98 | 98 |
| Example 7 | 98 | 97 | 98 | 97 | 97 | 98 | 99 | 100 | 99 | 87 | 94 | 89 | 85 | 99 | 96 | 97 |
| Comparative Example 4 | 85 | 90 | 85 | 77 | 85 | 89 | 79 | 85 | 89 | 74 | 63 | 86 | 58 | 88 | 87 | 91 |

As can be seen from Tables 11 and 12, the white LED of Comparative Example 4 only showed unsatisfactory characteristics in terms of the maximum value/the minimum value and color rendering, whereas the white LEDs of the examples were able to obtain satisfactory results on all characteristics.

When color rendering of the white LEDs of Examples 10-16 was compared with that in Example 7, there were no significant differences in the average color rendering index, but it was confirmed that the white LEDs of Examples 10-16 are superior overall in the special color rendering indices (R9 to R15). Thus, it became clear that the use of the mixed phosphor for the blue fluorescent film can exert more excellent effects in terms of color rendering. Therefore, the shape of the emission spectrum in each of Examples 10-16 is closer to that of white light that is obtained by blackbody radiation and that has the same color temperature as the white light of each Example.

According to the comparison of Examples 10-16, it is understood that the white light sources of Examples 10-14 and 16 containing only the europium activated alkaline earth halophosphate phosphors as the blue phosphor, have overall high special color rendering index values, and are excellent in color rendering as compared to Example 15.

According to the comparison of Examples 10-12, when a plurality of blue phosphors having different light emission peak wavelengths are used, it can be understood that the white light sources of Examples 10 and 11 in which the proportion of the blue phosphor having the short wavelength emission peak wavelength is larger than those of the other blue phosphors has a higher special color rendering index R11 than in Example 12, and is excellent in color rendering properties as compared to Example 12.

Comparative Example 7

A white LED was made by combining an InGaN-based blue LED having an emission peak at 450 nm with the green to yellow phosphor (4) and the red phosphor (7). The color temperature of the white light was 5000 K. The mixing ratio of the phosphors was 85 wt % for the green to yellow phosphor (4) and 15 wt % for the red phosphor (7). The average particle diameter of each of the phosphors and the film thickness of the mixed phosphor were the same as in Comparative Example 4.

Figure 13:
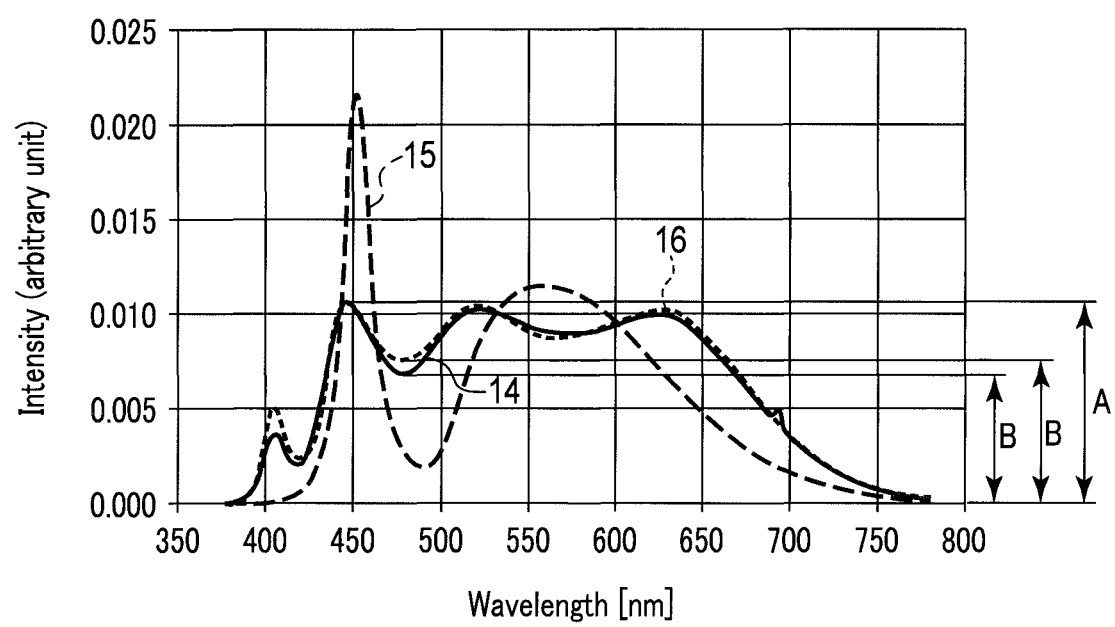
FIG. 13 is an emission spectrum of white light emitted from the white light sources of Examples 1 and 11, and Comparative Example 7.

The emission spectra of Examples 1 and 11, and Comparative Example 7 are shown in FIG. 13. In FIG. 13, the emission spectrum of Example 1 is represented by 14, the emission spectrum of Example 11 is represented by 16, and the emission spectrum of Comparative Example 7 is represented by 15.

As is apparent from FIG. 13, in the white light source of Comparative Example 7, there is an emission spectrum peak at which the ratio of the maximum value to the minimum value (A/B) is 1.9 or greater at a wavelength of 450 nm. On the other hand, in the emission spectra of the white light sources of Examples 1 and 11, there are two maximum values in the wavelength range of 400 nm to 500 nm. The maximum value located on the longer wavelength side is the maximum value in Examples 1 and 11 and is indicated by A in FIG. 13. The minimum value in the concave portion adjacent to the peak indicating the maximum value A is indicated by B. As shown in Tables 5 and 11, in the emission spectrum of the white light source of Examples 1 and 11, there is an emission spectrum peak in which the ratio of the maximum value to the minimum value (A/B) is less than 1.9. The white light emitted from the white light source of Examples 1 and 11 has a continuous spectrum over the wavelength range of 400 nm to 780 nm. When the emission spectrum 14 of Example 1 is compared with the emission spectrum 16 of Example 11, the change in emission intensity in the wavelength range of 450 nm to 500 nm is smaller in Example 11 than in Example 1. Therefore, the shape of the emission spectrum in Example 11 is closer to that of white light that is obtained by blackbody radiation and that has the same color temperature as the white light of Example 11. This is because the emission wavelength range in the visible wavelength range of 400 nm to 500 nm can be made wider than in Example 1, as the white light source of Example 11 has a first blue phosphor having an emission peak wavelength in the range of 430 nm to 470 nm and a second blue phosphor having an emission peak wavelength exceeding 470 nm and within the range of 485 nm.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A white light source comprising:
a light emitting diode (LED); and
phosphors,
wherein one of the phosphors is at least a cerium activated yttrium aluminum garnet-based phosphor,
wherein there is no light emission spectrum peak that has a ratio of a largest maximum value to a minimum value of greater than 1.9,
wherein the ratio is defined by a light emission spectrum intensity in a wavelength that indicates the largest maximum value divided by a light emission spectrum intensity in a wavelength that indicates the minimum value,
wherein the largest maximum value is a largest value among at least one maximum light emission intensity value present in a wavelength range of 400 nm to 500 nm in a light emission spectrum of white light emitted from the white light source,
wherein the minimum value is a light emission intensity value having a minimum value and being adjacent to the largest maximum value in a longer wavelength side of the light emission spectrum, and
wherein an average color rendering index Ra of white light emitted from the white light source is 96 or higher, and wherein all color rendering indices R1 to R15 are 85 or higher.

2. The white light source according to claim 1, wherein the LED emits ultraviolet to violet light having an emission peak in a wavelength range of 350 nm to 420 nm,
wherein the phosphors constitute a mixed phosphor that further includes a blue phosphor, and
wherein white light emitted from the mixed phosphor has a continuous spectrum over a wavelength range of 400 nm to 780 nm.

3. The white light source according to claim 2, wherein the cerium activated yttrium aluminum garnet-based phosphor is a green to yellow phosphor having an emission peak in a wavelength range of 510 nm to 570 nm, and
wherein the blue phosphor is made of at least one of a europium activated alkaline earth halophosphate phosphor and a europium activated barium magnesium aluminate phosphor, and has an emission peak in a wavelength range of 430 nm to 480 nm.

4. The white light source according to claim 2, wherein the cerium activated yttrium aluminum garnet-based phosphor is a green to yellow phosphor having an emission peak in a wavelength range of 510 nm to 570 nm, and
wherein the blue phosphor is a mixed phosphor consisting of at least one type of a first blue phosphor having an emission peak in a range of 430 nm to 470 nm, and at least one type of a second blue phosphor having an emission peak in a range of a wavelength longer than 470 nm to 485 nm,
wherein the first blue phosphor is at least one of a europium activated alkaline earth halophosphate phosphor and a europium activated alkaline earth aluminate phosphor, and
wherein the second blue phosphor is a europium activated alkaline earth halophosphate phosphor.

5. The white light source according to claim 4, wherein the first blue phosphor in the mixed phosphor is present in an amount of 50 wt % by weight or more with respect to an entire amount of the blue phosphor, and
wherein the second blue phosphor in the mixed phosphor is present in an amount of 50 wt % or less with respect to the entire amount of the blue phosphor.

6. The white light source according to claim 3, wherein the blue phosphor is a europium activated alkaline earth halophosphate phosphor having a chemical composition expressed as $(Sr_{1-x-y}Ba_xCa_y)_5(PO_4)_3Cl$: Eu, wherein x and y satisfy $0 \leq x \leq 0.44$, $0 \leq y \leq 0.1$.

7. The white light source according to claim 3, further comprising a europium activated alkaline earth orthosilicate phosphor as the green to yellow phosphor.

8. The white light source according to claim 6, wherein an emission peak wavelength of the blue phosphor is in a range of 440 nm to 470 nm.

9. The white light source according to claim 6, wherein the blue phosphor is a europium activated alkaline earth halophosphate phosphor having a chemical composition expressed as $(Sr_{1-x-y}Ba_xCa_y)_5(PO_4)_3Cl$: Eu, wherein x and y satisfy $0 \leq x \leq 0.35$ and $0 \leq y \leq 0.1$.

10. The white light source according to claim 6, wherein the phosphors include two kinds of phosphors, including the cerium activated yttrium aluminum garnet-based phosphor and a europium activated alkaline earth halophosphate phosphor, and
wherein a weight ratio of the cerium activated yttrium aluminum garnet-based phosphor to the europium activated alkaline earth halophosphate phosphor is in a range of 29:71 parts by weight to 10:90 parts by weight.

11. The white light source according to claim 1, wherein the phosphors include a red phosphor, and
wherein the red phosphor is at least one of a europium activated strontium sialon phosphor, a europium activated alkaline earth nitride aluminosilicate phosphor, and a manganese activated magnesium fluorogermanate phosphor.

12. The white light source according to claim 1, wherein an average particle diameter of the phosphors is 10 μm or longer and 50 μm or shorter.

* * * * *